(12) United States Patent
Min et al.

(10) Patent No.: US 10,153,358 B2
(45) Date of Patent: Dec. 11, 2018

(54) SEMICONDUCTOR DEVICE AND METHOD FOR MANUFACTURING THE SAME

(71) Applicant: SAMSUNG ELECTRONICS CO., LTD., Suwon-si, Gyeonggi-do (KR)

(72) Inventors: Kyungseok Min, Yongin-si (KR); Seongjin Nam, Seongnam-si (KR); Sughyun Sung, Yongin-si (KR); Youngmook Oh, Hwaseong-si (KR); Migyeong Gwon, Seoul (KR); Hyungdong Kim, Seongnam-si (KR); InWon Park, Yongin-si (KR); Hyunggoo Lee, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/390,754

(22) Filed: Dec. 27, 2016

(65) Prior Publication Data
US 2017/0236921 A1 Aug. 17, 2017

(30) Foreign Application Priority Data
Feb. 17, 2016 (KR) .................. 10-2016-0018633

(51) Int. Cl.
*H01L 29/66* (2006.01)
*H01L 29/10* (2006.01)
(Continued)

(52) U.S. Cl.
CPC ...... *H01L 29/66795* (2013.01); *H01L 21/308* (2013.01); *H01L 21/3065* (2013.01); *H01L 21/31116* (2013.01); *H01L 21/31144* (2013.01); *H01L 21/6833* (2013.01); *H01L 23/535* (2013.01); *H01L 29/0653* (2013.01); *H01L 29/0847* (2013.01); *H01L 29/1037* (2013.01); *H01L 29/161* (2013.01); *H01L 29/165* (2013.01); *H01L 29/1608* (2013.01); *H01L 29/7848* (2013.01); *H01L 29/7851* (2013.01)

(58) Field of Classification Search
None
See application file for complete search history.

(56) References Cited

U.S. PATENT DOCUMENTS

| 7,678,648 | B2 | 3/2010 | Torek et al. |
| 7,709,341 | B2 | 5/2010 | Fucsko et al. |

(Continued)

FOREIGN PATENT DOCUMENTS

| KR | 10-2010-0081832 A | 7/2010 |
| KR | 10-2011-0014443 A | 2/2011 |

*Primary Examiner* — Alexander Ghyka
(74) *Attorney, Agent, or Firm* — Lee & Morse, P.C.

(57) ABSTRACT

A semiconductor device includes a fin structure which vertically protrudes from a substrate and extends in a first direction parallel to a top surface of the substrate. The fin structure includes a lower pattern and an active pattern vertically protruding from a top surface of the lower pattern. The top surface of the lower pattern includes a flat portion substantially parallel to the top surface of the substrate. The lower pattern includes a first sidewall extending in the first direction and a second sidewall extending in a second direction crossing the first direction. The first sidewall is inclined relative to the top surface of the substrate at a first angle greater than a second angle corresponding to the second sidewall that is inclined relative to the top surface of the substrate.

11 Claims, 45 Drawing Sheets

(51) Int. Cl.
*H01L 29/78* (2006.01)
*H01L 29/06* (2006.01)
*H01L 23/535* (2006.01)
*H01L 29/08* (2006.01)
*H01L 29/16* (2006.01)
*H01L 29/161* (2006.01)
*H01L 29/165* (2006.01)
*H01L 21/3065* (2006.01)
*H01L 21/308* (2006.01)
*H01L 21/311* (2006.01)
*H01L 21/683* (2006.01)

(56) References Cited

U.S. PATENT DOCUMENTS

| | | |
|---|---|---|
| 7,718,538 B2 | 5/2010 | Kim et al. |
| 7,994,020 B2 | 8/2011 | Lin et al. |
| 8,008,163 B2 | 8/2011 | Jang et al. |
| 8,227,354 B2 | 7/2012 | Kim et al. |
| 9,129,823 B2 | 9/2015 | Chuang et al. |
| 9,190,287 B2 | 11/2015 | Nakagawa et al. |
| 2014/0227857 A1 | 8/2014 | Youn et al. |
| 2015/0056815 A1 | 2/2015 | Fernandez et al. |
| 2015/0123211 A1 | 5/2015 | Zhang et al. |

(COMPARATIVE EXAMPLE)

(COMPARATIVE EXAMPLE)

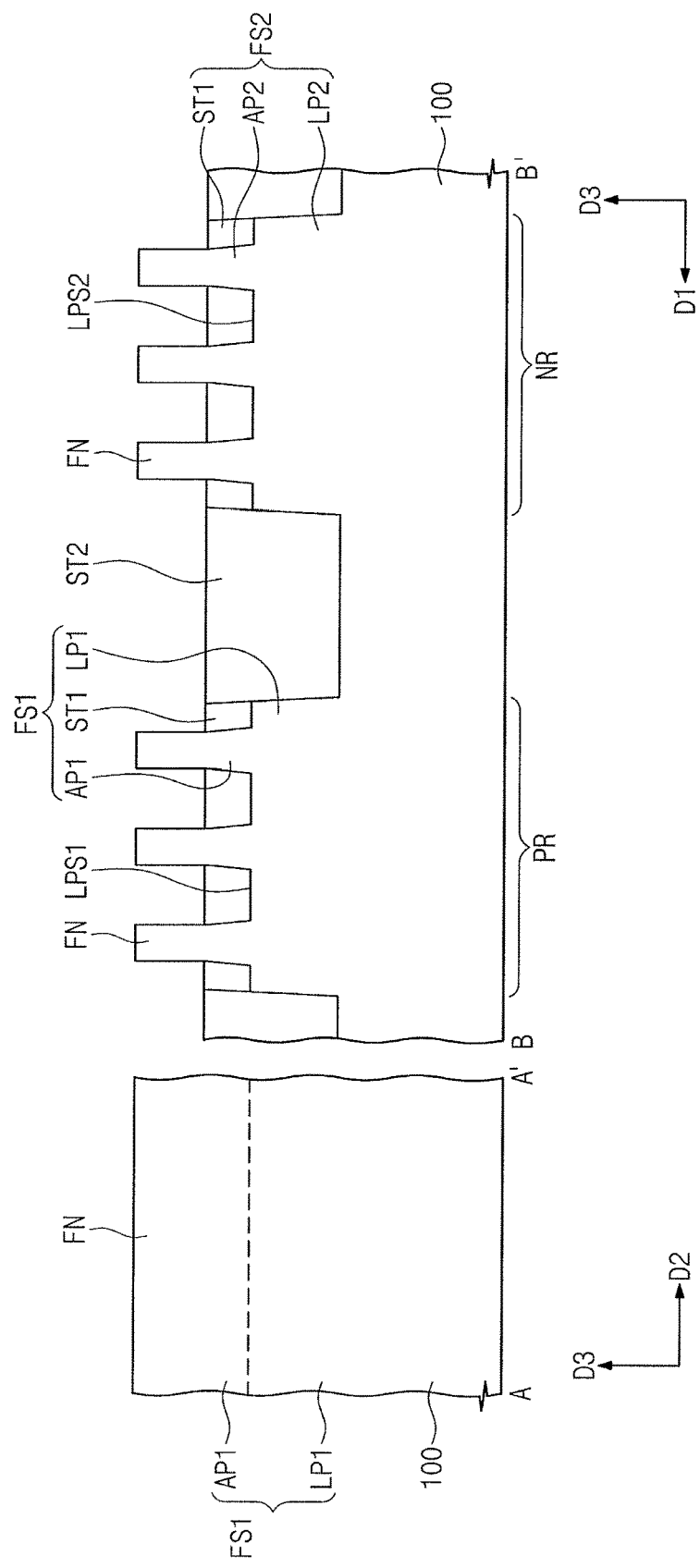

SEMICONDUCTOR DEVICE AND METHOD FOR MANUFACTURING THE SAME

CROSS-REFERENCE TO RELATED APPLICATION

Korean Patent Application No. 10-2016-0018633, filed on Feb. 17, 2016, and entitled, "Semiconductor Device and Method for Manufacturing the Same," is incorporated by reference herein in its entirety.

BACKGROUND

1. Field

One or more embodiments described herein relate to a semiconductor device and a method for manufacturing a semiconductor device.

2. Description of the Related Art

Semiconductor devices are widely used in the electronics industry because of their small size, multiple functionality, and/or low fabrication cost. Semiconductor memory devices perform the function of storing logic data. Semiconductor logic devices perform the function of processing logic data. A hybrid semiconductor device performs both functions. There is a continuing demand for producing semiconductor devices with greater reliability, speed, functionality. Attempts have been made to achieve these goals. However, the structures of current semiconductor devices are excessively complicated.

SUMMARY

In accordance with one or more embodiments, a semiconductor device includes a fin structure vertically protruding from a substrate and extending in a first direction parallel to a top surface of the substrate, the fin structure including a lower pattern and an active pattern vertically protruding from a top surface of the lower pattern, wherein the top surface of the lower pattern includes a flat portion substantially parallel to the top surface of the substrate, and wherein the lower pattern includes a first sidewall extending in the first direction and a second sidewall extending in a second direction crossing the first direction, the first sidewall inclined relative to the top surface of the substrate at a first angle greater than a second angle corresponding to the second sidewall that is inclined relative to the top surface of the substrate.

In accordance with one or more other embodiments, a method for manufacturing a semiconductor device includes forming first trenches on a substrate that define active patterns extending in a first direction; forming a first insulation layer that fills the first trenches; forming a mask pattern on the first insulation layer, the mask pattern extending in the first direction and vertically overlapping at least one of the active patterns; and etching the active patterns, the first insulation layer, and an upper portion of the substrate using the mask pattern as an etch mask in order to form a second trench that defines a fin structure, wherein forming the second trench includes: patterning the active patterns and the first insulation layer using the mask pattern as an etch mask until a top surface of the substrate is partially exposed; and patterning the exposed substrate using the mask pattern as an etch mask, wherein patterning the active patterns and the first insulation layer is performed in a process chamber which includes a susceptor on which the substrate is placed and an RF bias connected to the susceptor, the RF bias applied in a pulsed manner.

In accordance with one or more other embodiments, a method for manufacturing a semiconductor device includes providing a substrate; and etching the substrate to form a fin structure of a transistor, the fin structure including a first sidewall inclined at a first angle and a second sidewall inclined at a second angle different from the first angle, wherein the etching is performed based on a pulsed RF bias.

BRIEF DESCRIPTION OF THE DRAWINGS

Features will become apparent to those of skill in the art by describing in detail exemplary embodiments with reference to the attached drawings in which:

FIGS. 20B, 21B, 22B, 23B, 24B, 25B, and 26B illustrate views taken along lines A-A' and B-B' in FIGS. 20A, 21A, 22A, 23A, 24A, 25A, and 26A, respectively.

DETAILED DESCRIPTION

Figure 1:
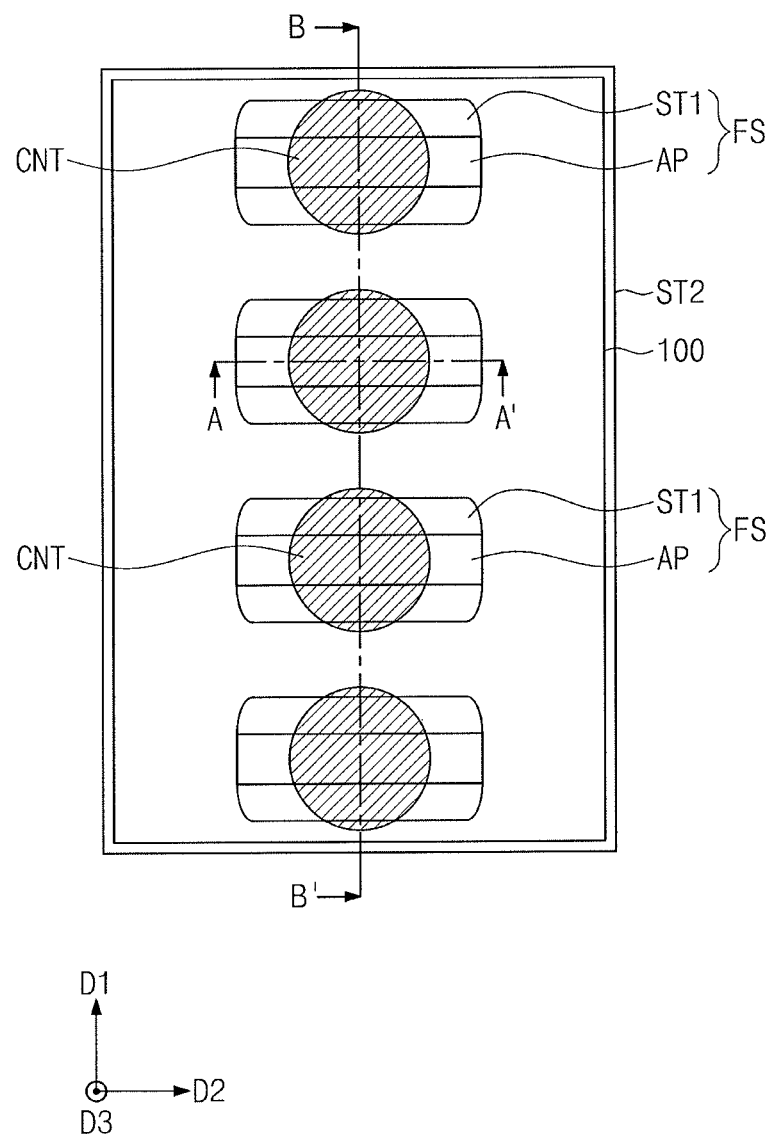
FIG. 1 illustrates an embodiment of a semiconductor device.
Figure 2:
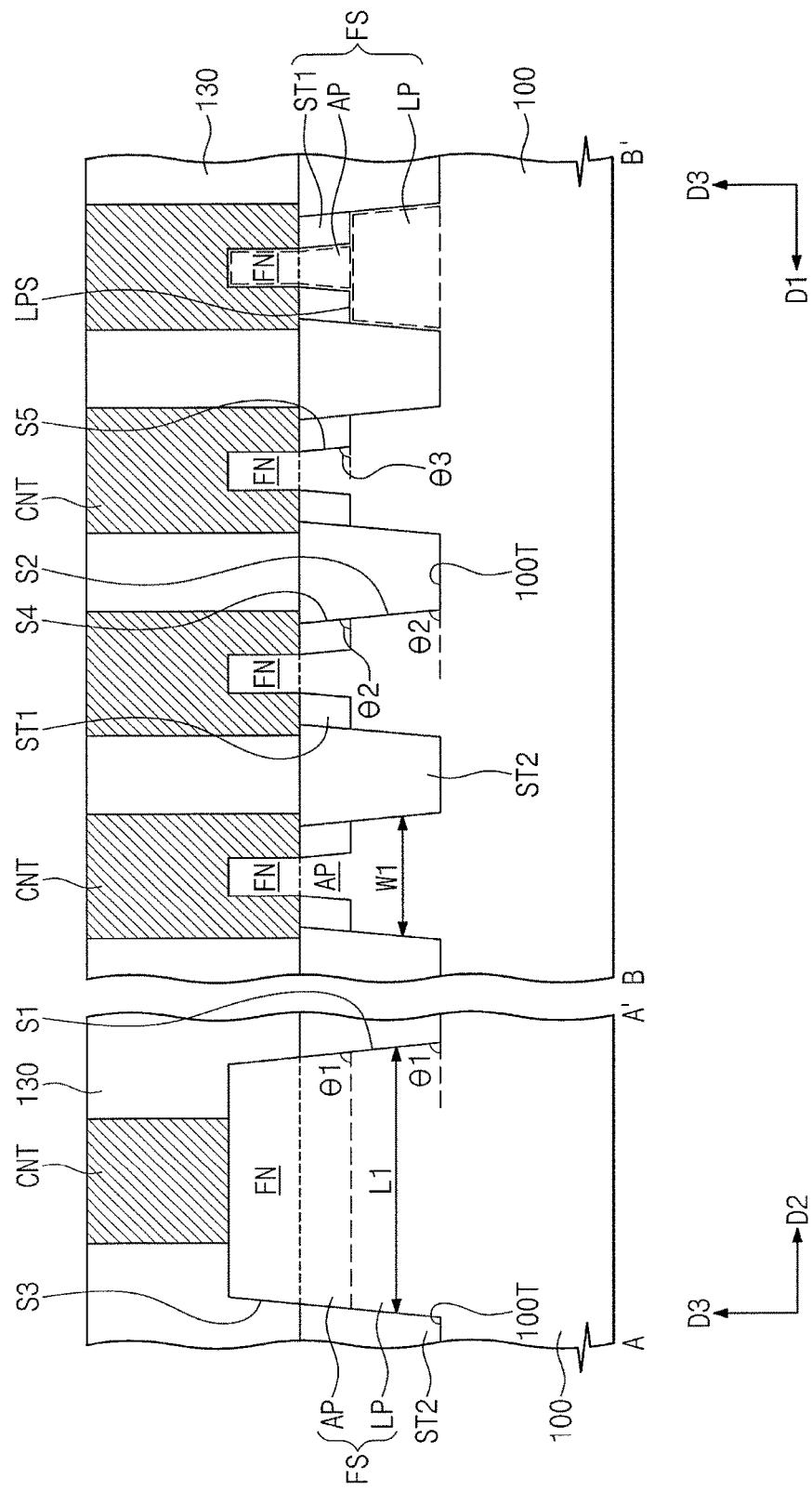
FIG. 2 illustrates a view taken along section lines A-A' and B-B' in FIG. 1.
Figure 3:
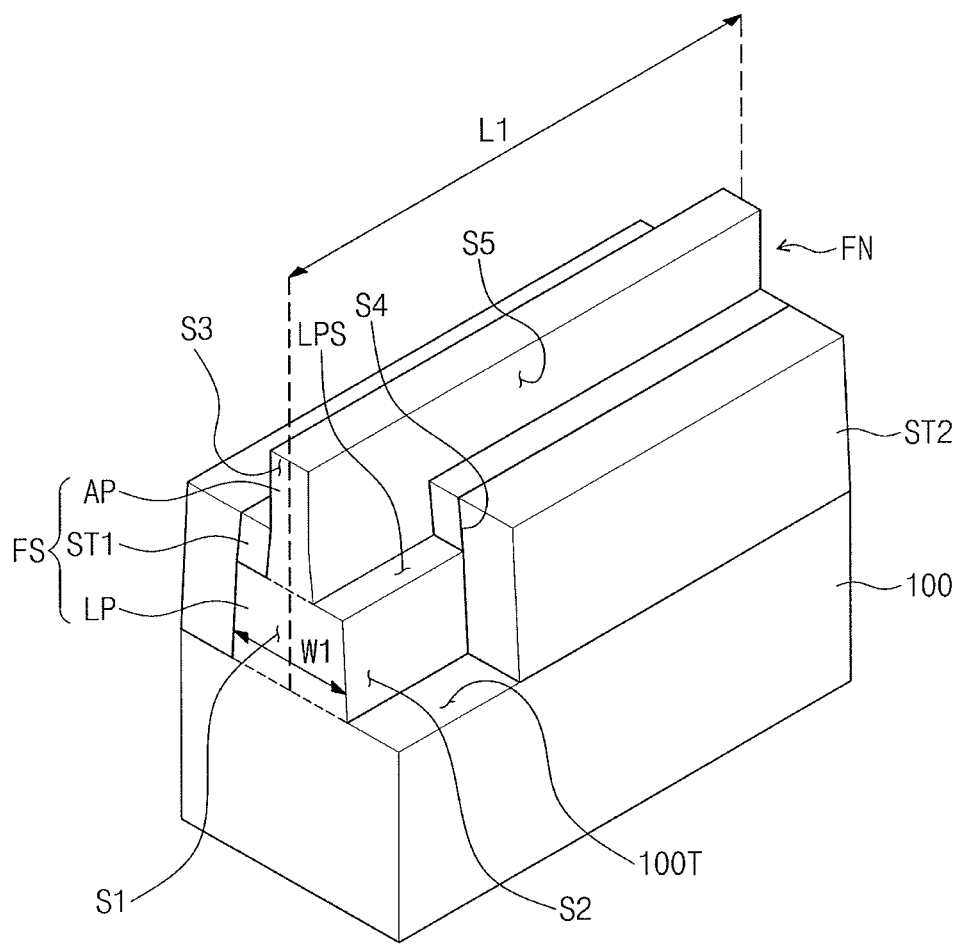
FIG. 3 illustrates an embodiment of a fin structure.

FIG. 1 illustrates an embodiment of a semiconductor device, FIG. 2 is a cross-sectional view taken along lines A-A' and B-B' in FIG. 1, and FIG. 3 is a perspective view illustrating an embodiment of a fin structure FS, which, for example, may be representative of the fin structures FS in the semiconductor device of FIG. 1.

Referring to FIGS. 1, 2, and 3, a plurality of fin structures FS are on a substrate 100, which, for example, may be a silicon substrate, a germanium substrate, or a SOI (silicon on insulator) substrate. The fin structures FS may be a portion of substrate 100 and protrude vertically (e.g., in a third direction D3) from a top surface 100T of the substrate 100. The fin structures FS may be arranged in a first direction D1 substantially parallel to the top surface 100T of the substrate 100.

Each fin structure FS may be in the shape of a line or bar extending in a second direction D2 crossing the first direction D1. Each fin structure FS may have a width W1 in the first direction D1 and a length L1 in the second direction D2 that gradually increase in a direction toward the bottom surface of the substrate 100. The ratio of a maximum length L1 to a maximum width W1 of the fin structures FS may be, for example, about 3.5 to about 5. The ratio may be different in another embodiment. The fin structures FS may be spaced apart from each other by predetermined amounts. For example, the fin structures FS may be spaced apart from each other at the same interval or different intervals along first direction D1.

A second device isolation pattern ST2 may fill a trench between the fin structures FS. For example, the second device isolation pattern ST2 may help define the fin structures FS. In one embodiment, the second device isolation pattern ST2 may envelop each of the fin structures FS and electrically separate the fin structures FS from each other. In one embodiment, the second device isolation pattern ST2 may have a top surface coplanar with top surfaces of first device isolation patterns ST1. The second device isolation pattern ST2 may include, for example, a silicon oxide layer.

Each fin structure FS may include a lower pattern LP, an active pattern AP that vertically protrudes from a top surface of the lower pattern LP, and a pair of first device isolation patterns ST1 that cover opposing sidewalls S5 of the active pattern AP. The active pattern AP may be integrally connected to the lower pattern LP. The active pattern AP and the lower pattern LP may be a portion of the substrate 100, and thus may include a semiconductor material substantially the same as the substrate 100. For convenience, one single fin structure FS may be discussed hereinafter.

The lower pattern LP may be at a lower part of the fin structure FS. The top surface of the lower pattern LP may include a pair of flat portions LPS on opposing sides of the active pattern AP. The flat portions LPS may be substantially coplanar with the top surface 100T of the substrate 100. The first device isolation patterns ST1 may respectively directly cover the flat portions LPS. The flat portions LPS may have, for exampled, a line or bar shape extending in the second direction D2.

The lower pattern LP may include a first sidewall S1 extending in the first direction D1 and a second sidewall S2 extending in the second direction D2. The second device isolation pattern ST2 may be in direct contact with the first and second sidewalls S1 and S2. The first sidewall S1 may be inclined to the top surface 100T of the substrate 100 at a first angle $\theta 1$. The second sidewall S2 may be inclined to the top surface 100T of the substrate 100 at a second angle $\theta 2$. The second angle $\theta 2$ may be greater than the first angle $\theta 1$. For example, the first angle $\theta 1$ may be in the range of about 70° to about 85° and the second angle $\theta 2$ may be in the range of about 85° to about 90°. Thus, the first sidewall S1 may have different (or more gradual) slope down toward the top surface 100T of the substrate 100 compared with the second sidewall S2.

The active pattern AP may include an upper portion FN exposed between the first device isolation patterns ST1. The upper portion FN of the active pattern AP may have a fin shape that protrudes among the first and second device isolation layers ST1 and ST2. The active pattern AP may include a third sidewall S3 extending in the first direction D1 and a fifth sidewall S5 extending in the second direction D2.

The third sidewall S3 may be inclined to the top surface 100T of the substrate 100 at an angle, which, for example, may be substantially the same as the first angle $\theta 1$. In one embodiment, the third sidewall S3 may be aligned with the first sidewall S1. The third sidewall S3 and the first sidewall S1 may constitute a sidewall, extending in the first direction D1, of the fin structure FS.

The fifth sidewall S5 may be inclined to the top surface 100T of the substrate 100 at a third angle $\theta 3$. The third angle $\theta 3$ may be different from the first and second angles $\theta 1$ and $\theta 2$. The fifth sidewall S5 may be spaced apart from the second sidewall S2. The fifth sidewall S5 may also be spaced apart from the second device isolation pattern ST2, with the first device isolation pattern ST1 therebetween.

The first device isolation patterns ST1 may be respectively disposed on the flat portions LPS. The first device isolation patterns ST1 may have a line or bar shape extending in the second direction D2.

Each of the first device isolation patterns ST1 may include a fourth sidewall S4 extending in the second direction D2. The fourth sidewall S4 may be inclined to the top surface 100T of the substrate 100 at an angle, which, for example, may be substantially the same as the second angle $\theta 2$. Thus, the fourth sidewall S4 may be aligned with the second sidewall S2. The fourth sidewall S4 and the second sidewall S2 may constitute a sidewall, extending in the second direction D2, of the fin structure FS.

The first device isolation pattern ST1 and the second device isolation pattern ST2 may substantially integrally connected to each other to form a single insulation layer. The second device isolation pattern ST2 may have a thickness greater than that of the first device isolation pattern ST1. The first device isolation pattern ST1 and the second device isolation pattern ST2 may be formed by individual processes. For example, the first device isolation pattern ST1 may include a silicon oxide layer.

An interlayer dielectric layer 130 may be provided on the substrate 100 to cover the fin structure FS and the second device isolation pattern ST2. For example, the interlayer dielectric layer 130 may include a silicon oxide layer.

A plurality of contact plugs CNT may be provided to penetrate the interlayer dielectric layer 130 to be respectively electrically connected to each of the active patterns AP of the fin structures FS. Each of the contact plugs CNT may apply voltage to the substrate 100 through the fin structure FS. The contact plug CNT may be a well contact and apply a specific voltage (e.g., a ground voltage or a power voltage) to the substrate 100. The fin structures FS may serve as a pick-up region of the substrate 100.

Each of the contact plugs CNT may be in direct contact with the upper portion FN of the active pattern AP. Particularly, each of the contact plugs CNT may cover not only a top surface of the upper portion FN but also the opposing sidewalls S5 of the upper portion FN. Thus, a contact area between the contact plug CNT and the active pattern AP may be increased such that an electrical resistance thereof may be reduced. For example, the contact plugs CNT may include at least one of doped semiconductor, conductive metal nitride (e.g., titanium nitride, tantalum nitride, etc.), and metal (e.g., aluminum, tungsten, etc.).

Figure 10:
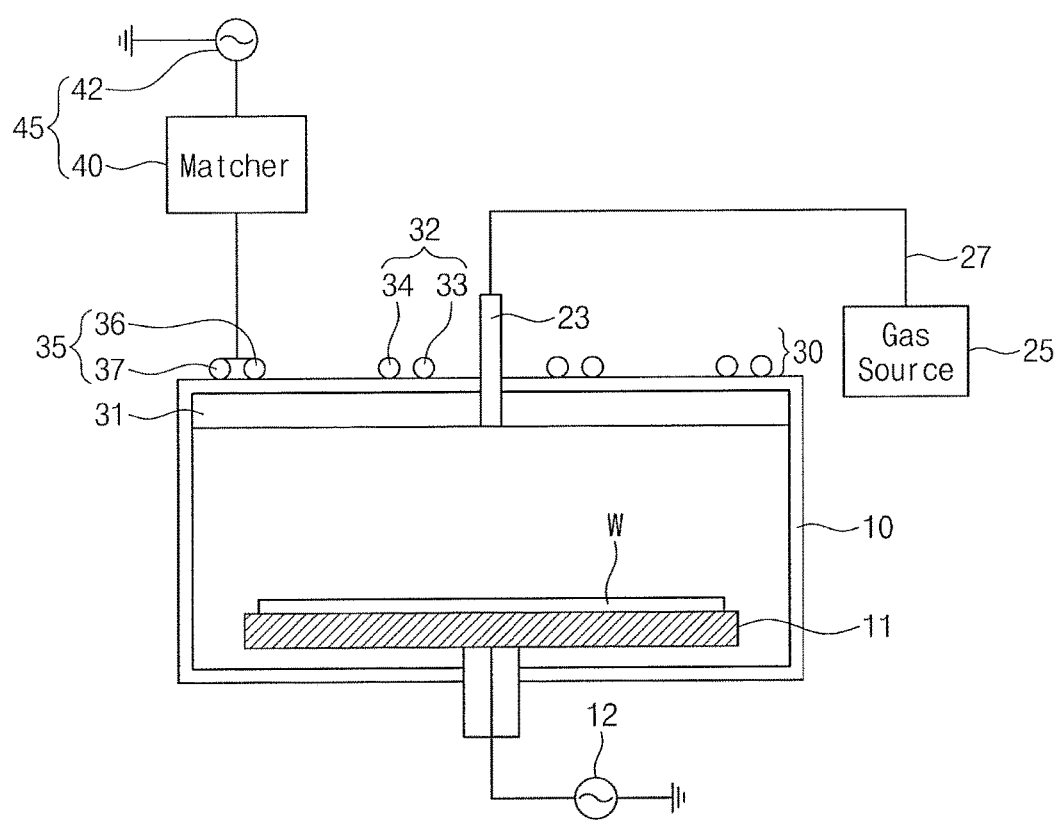
FIG. 10 illustrates an embodiment of an etching apparatus for forming fin structures.
Figure 11:
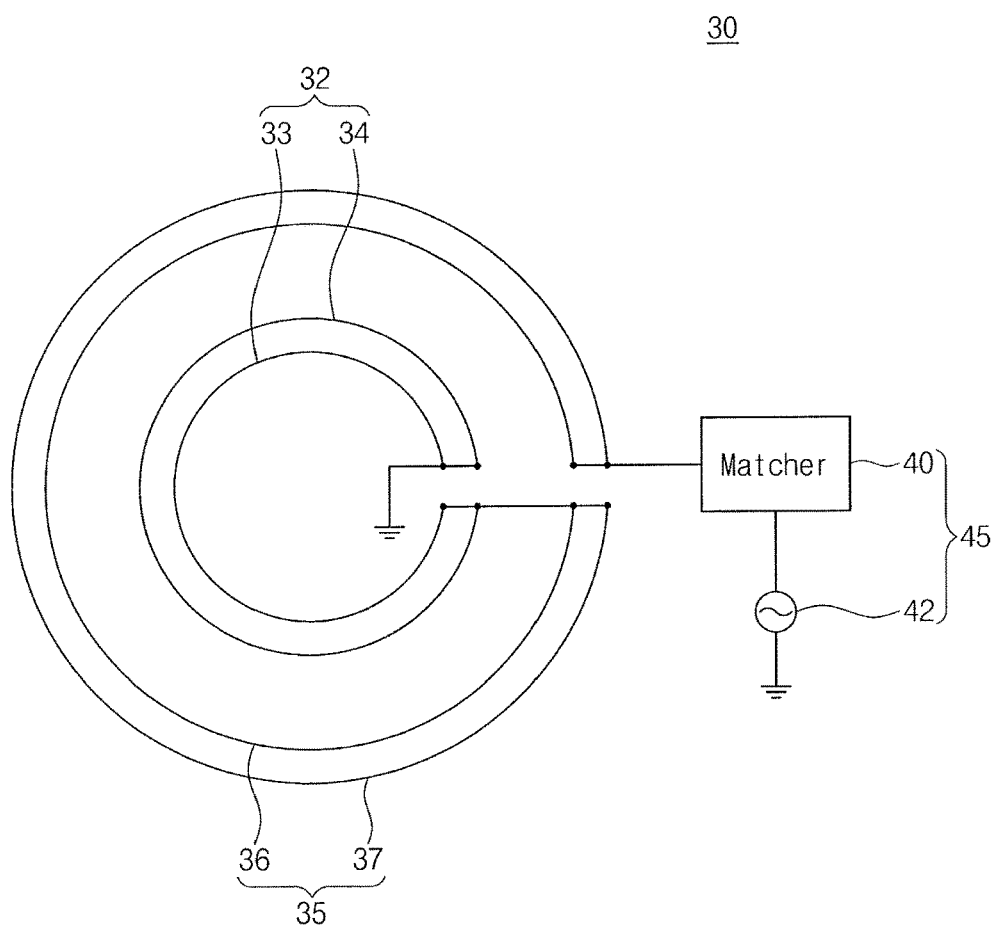
FIG. 11 illustrates an example of an inductively coupled plasma (ICP) antenna.
Figure 12:
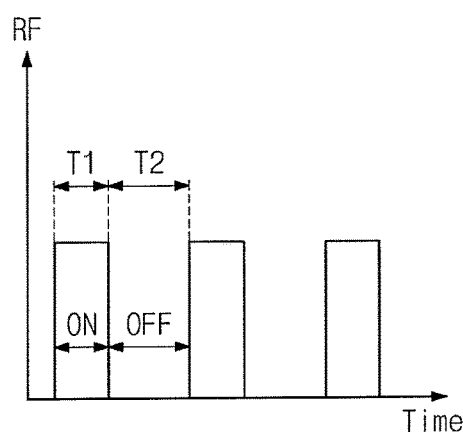
FIG. 12 illustrates an embodiment of a pulsed RF bias for an etch process.
Figure 13A:
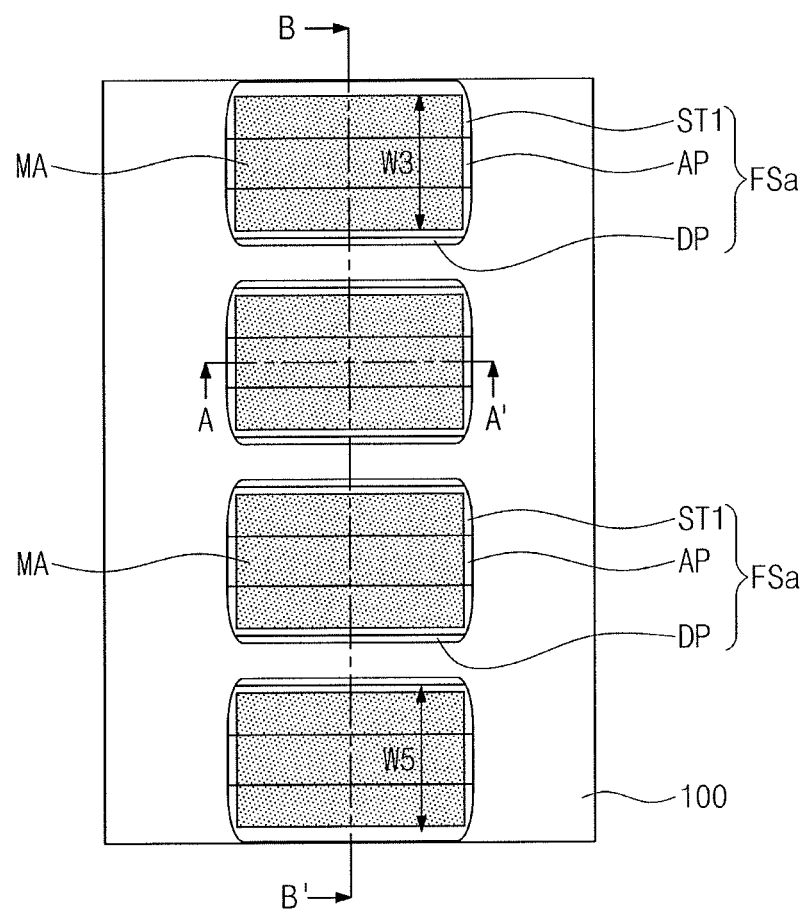
FIG. 13A illustrates a comparative method for manufacturing a semiconductor device.
Figure 13B:
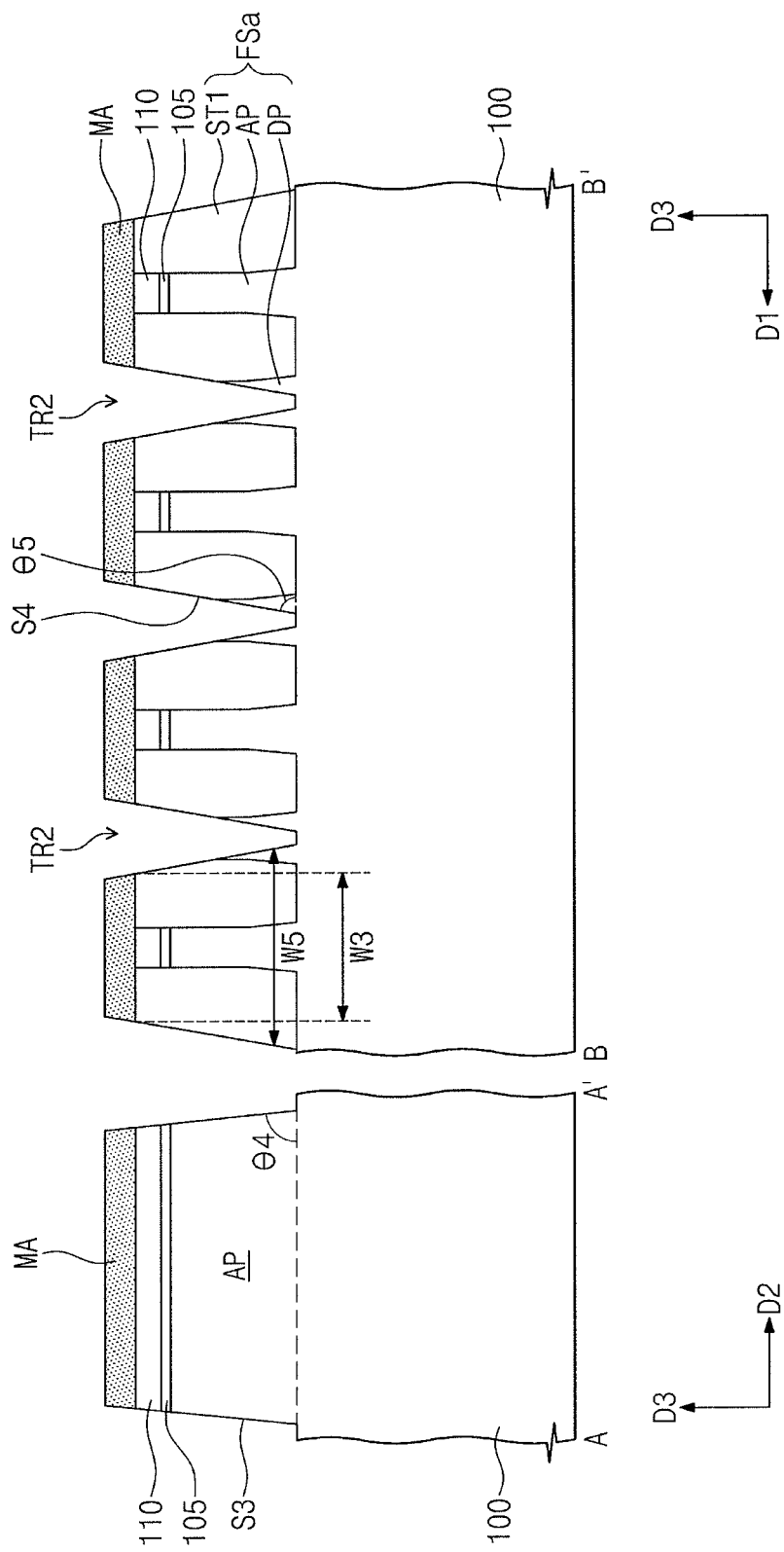
FIG. 13B illustrates a view along section lines A-A' and B-B' in FIG. 13A.

FIGS. 4A, 5A, 6A, 7A, 8A and 9A are plan views illustrating a method for manufacturing a semiconductor device according to exemplary embodiment of the present inventive concept. FIGS. 4B, 5B, 6B, 7B, 8B and 9B are cross-sectional views taken along lines A-A' and B-B' of FIGS. 4A, 5A, 6A, 7A, 8A and 9A, respectively. FIG. 10 is a schematic diagram illustrating an etching apparatus used for forming fin structures according to exemplary embodiments of the present inventive concept. FIG. 11 is a plan view illustrating an example of ICP antenna of FIG. 10. FIG. 12 is a graph illustrating a pulsed RF bias used in an etch process according to exemplary embodiments of the present inventive concept. FIG. 13A is a plan view illustrating a comparative method for manufacturing a semiconductor device. FIG. 13B is a cross-sectional view taken along lines A-A' and B-B' of FIG. 13A.

Figure 4A:
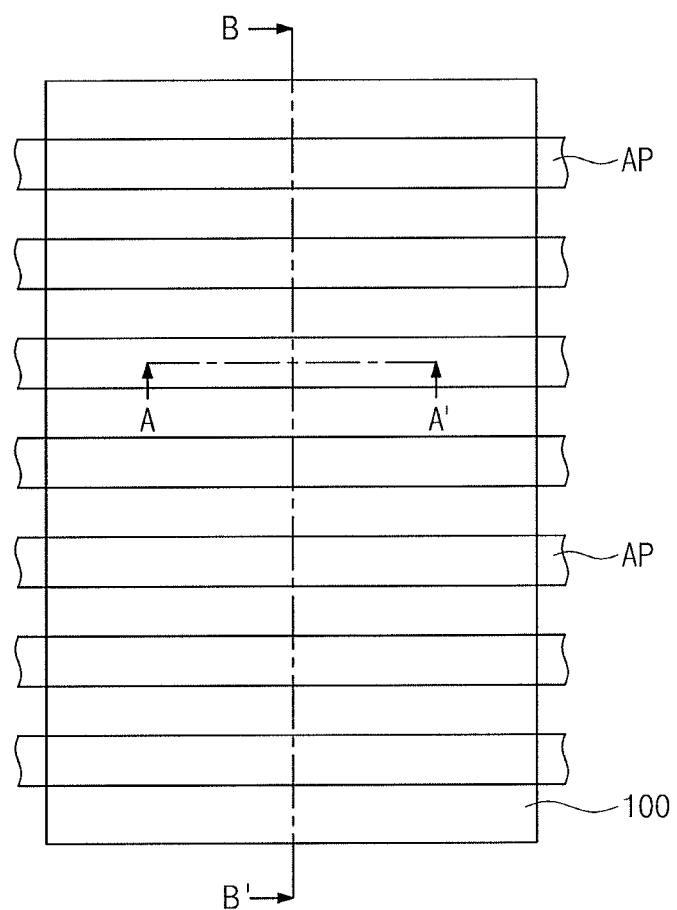
FIGS. 4A, 5A, 6A, 7A, 8A, and 9A an embodiment of a method for manufacturing a semiconductor device.
Figure 4B:
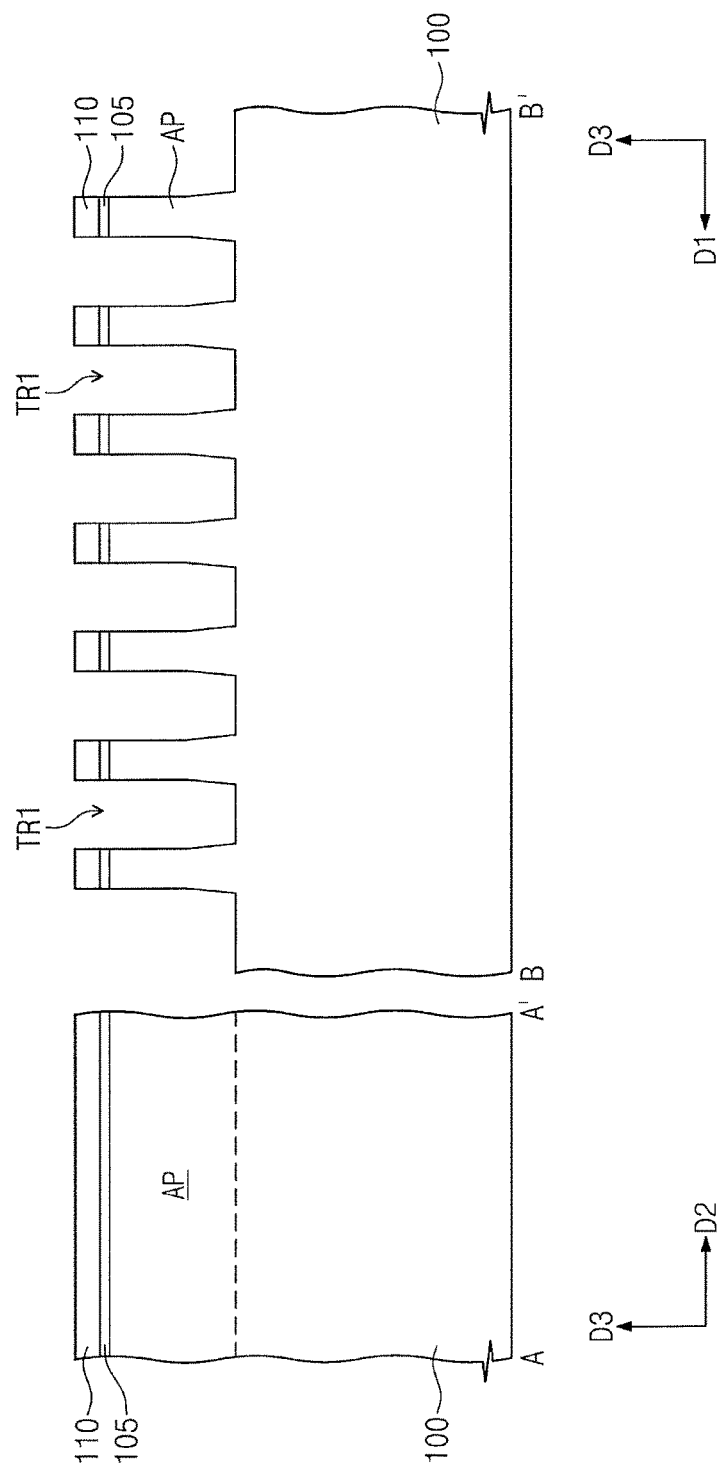
FIGS. 4B, 5B, 6B, 7B, 8B, and 9B illustrate views taken along section lines A-A' and B-B' in FIGS. 4A, 5A, 6A, 7A, 8A, and 9A, respectively.

Referring to FIGS. 4A and 4B, a substrate 100 may be patterned to form active patterns AP. For example, the substrate 100 may be a silicon substrate, a germanium substrate, or a SOI (silicon on insulator) substrate. The active patterns AP may have a shape of line or bar extending in a second direction D2 along a top surface of the substrate 100.

The formation of the active patterns AP may include etching an upper portion of the substrate 100 to form first trenches TR1 defining the active patterns AP. Each of the first trenches TR1 may have a depth greater than a width of the active patterns AP.

The first trenches TR1 may be formed by forming first mask patterns 110 on the substrate 100 and then anisotropically etching the substrate 100 using the first mask patterns 110 as an etch mask. For example, each of the first mask patterns 110 may include a plurality of sequentially stacked layers, each having a different etch selectivity. The first mask patterns 110 may include, for example, a silicon nitride layer. Prior to formation of the first mask patterns 110, buffer patterns 105 may be formed on the substrate 100. The buffer patterns 105 may include, for example, a silicon oxide layer or a silicon oxynitride layer.

Figure 5A:
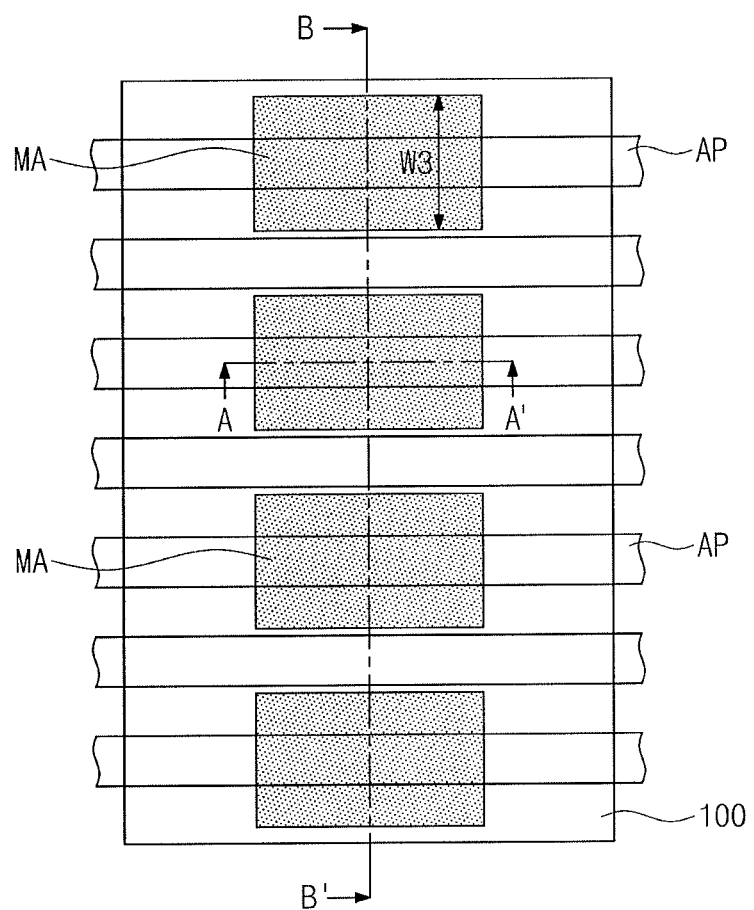
Figure 5A:
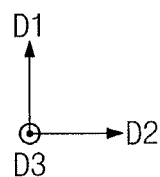
Figure 5B:
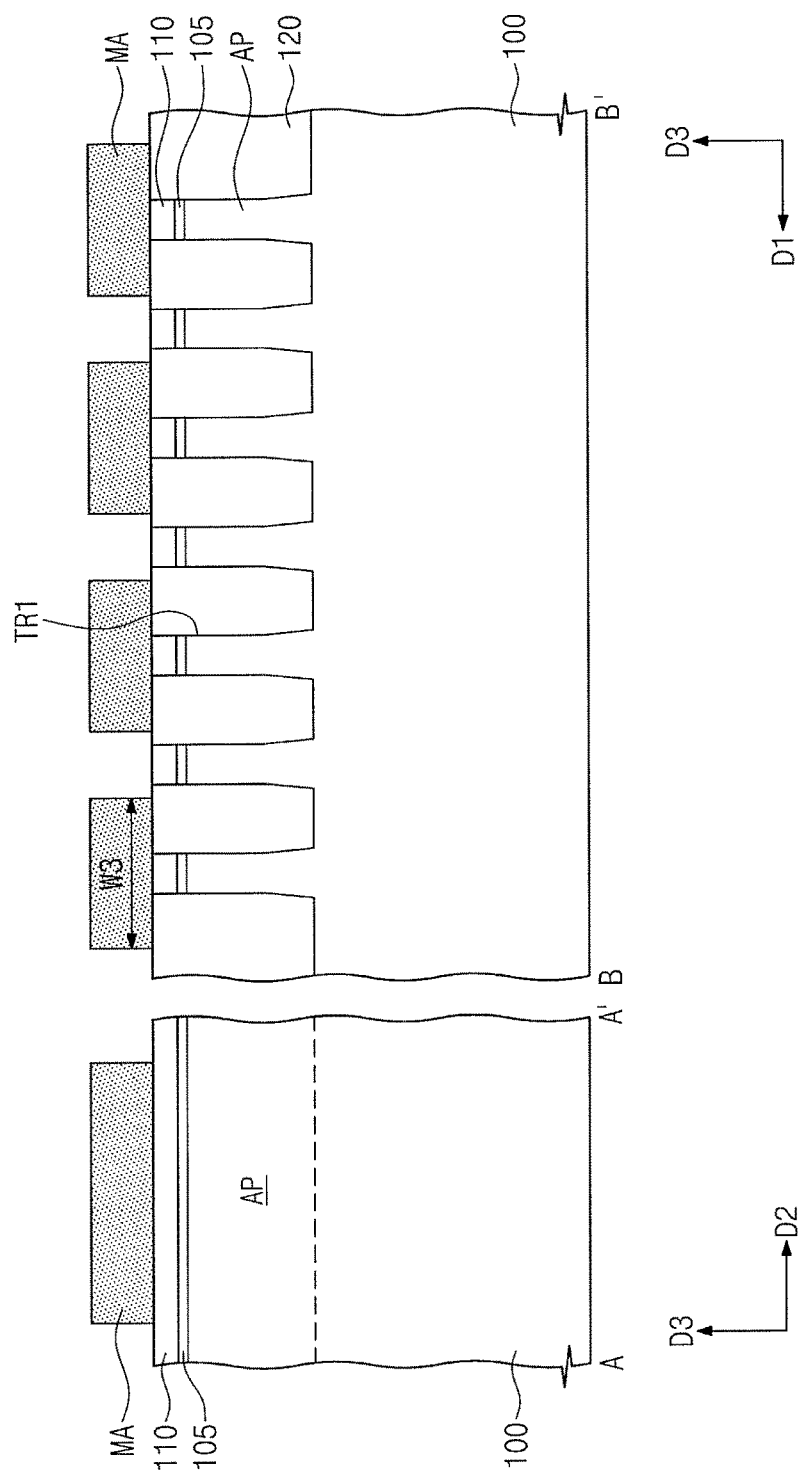

Referring to FIGS. 5A and 5B, a first insulation layer 120 may fill the first trenches TR1. The first insulation layer 120 may be formed to expose top surfaces of the first mask patterns 110. The first insulation layer 120 may include an oxide layer (e.g., a silicon oxide layer) formed by a flowable chemical vapor deposition (FCVD). Formation of the first insulation layer 120 may include, for example, depositing an insulative material on an entire surface of the substrate 100 and then planarizing the insulative material until the first mask patterns 110 are revealed.

Second mask patterns MA may be formed on the first insulation layer 120. The second mask patterns MA may have a line or bar shape extending in the second direction D2. The second mask patterns MA may be arranged in a first direction D1 crossing the second direction D2. Each of the second mask patterns MA may have a third width W3 in the first direction D1.

Each of the second mask patterns MA may vertically overlap one active pattern AP. In one embodiment, each of the second mask patterns MA may vertically overlap a portion of corresponding one active pattern AP and may not overlap other portions of the corresponding one active pattern AP. Another active pattern AP adjacent to the corresponding one active pattern AP may not vertically overlap the second mask pattern MA. In addition, each of the second mask patterns MA may vertically overlap a portion of the first insulation layer 120 adjacent to the corresponding one active pattern AP. For example, each of the second mask patterns MA may include a plurality of sequentially stacked layers each having a different etch selectivity. The second mask patterns MA may be forming using photoresist patterns.

Figure 6A:
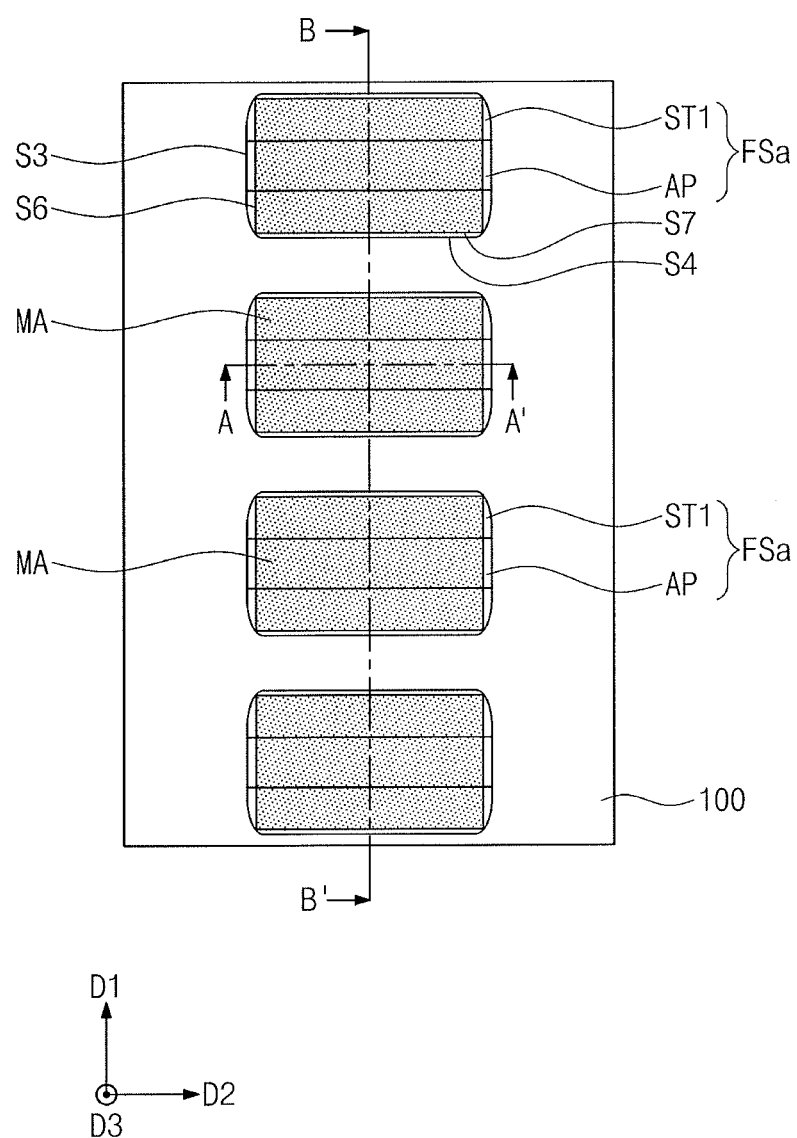
Figure 6B:
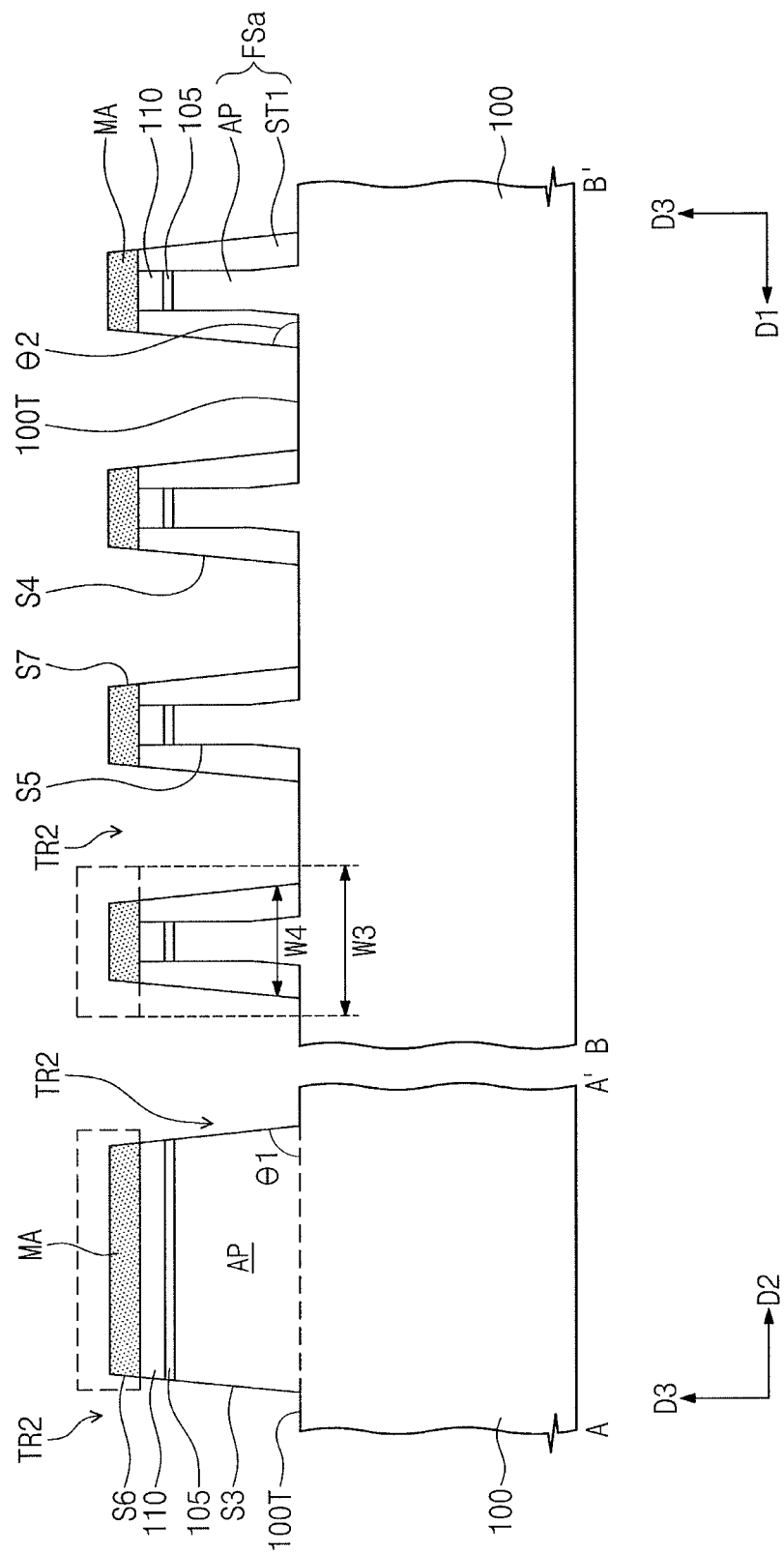

Referring to FIGS. 6A and 6B, a first etch process may be performed to form a preliminary fin structures FSa and a second trench TR2 defining the preliminary fin structures FSa. The first etch process may be performed to etch the first mask patterns 110, the buffer patterns 105, and the first insulation layer 120 using the second mask patterns MA as an etch mask. The first etch process may be carried out until the top surface 100T of the substrate 100 is revealed. Each of the preliminary fin structures FSa may include the active pattern AP and a pair of first device isolation patterns ST1 on opposing sides of the active pattern AP.

During the first etch process, the active patterns AP exposed through the second mask patterns MA. Also, a portion of the first insulation layer 120 exposed through the second mask patterns MA may be removed. Since the first etch process removes the active patterns AP and the portion of the first insulation layer 120 exposed through the second mask patterns MA, the second trench TR2 may be formed to define the preliminary fin structures FSa.

The first device isolation patterns ST1 may be formed by removing the portion of the first insulation layer 120 exposed through the second mask patterns MA. The active patterns AP may include fifth sidewalls S5 extending in the second direction D2. The first device isolation patterns ST1 may cover the fifth sidewalls S5 of the active patterns AP. Each of the first device isolation patterns ST1 may include a fourth sidewall S4 extending in the second direction D2. The fourth sidewall S4 may be externally exposed through the second trench TR2.

Differently from the fifth sidewalls S5 of the active patterns AP covered with the first isolation patterns ST1, the active patterns AP may include third sidewalls S3 that are externally exposed through the second trench TR2.

Sizes of the second mask patterns MA may become smaller during the first etch process. Each of the second mask patterns MA may include a sixth sidewall S6 extending in the first direction D1 and a seventh sidewall S7 extending in the second direction D2. The sixth sidewall S6 may be aligned with the third sidewall S3, and the seventh sidewall S7 may be aligned with the fourth sidewall S4.

The third sidewall S3 of the preliminary fin structure FSa may be inclined relative to the top surface 100T of the substrate 100 at a first angle θ1. The fourth sidewall S4 of the preliminary fin structure FSa may be inclined relative to the top surface 100T of the substrate 100 at a second angle θ2. The second angle θ2 may be greater than the first angle θ1, e.g., the first angle θ1 may be between about 70° to about 85° and the second angle θ2 may be between about 85° to about 90°.

The preliminary structure FSa formed by the first etch process may include a width W4 that extends in the first direction D1 and is less than the width W3 of the second mask pattern MA, formed prior to the first etch process.

An embodiment of the first etch process will be discussed with reference to FIGS. 10 and 11. The first etch process may be performed, for example, in an etching apparatus 1 including a process chamber 10. The etching apparatus 1 may be, for example, a plasma etching equipment which uses an inductively coupled plasma (ICP) source. In an embodiment, the etching process 1 may include an ICP antenna 30 for generating inductively coupled plasma.

The etching process 1 may include a susceptor 11 in a lower portion of the process chamber 10 that holds a wafer W thereon. The susceptor 11 may be connected to a RF bias 12. The term "RF bias" may, for example, refer to the RF bias 12 connected to the susceptor 11. For example, RF bias 12 may supply susceptor 11 with high frequency or radio frequency (RF) power in a predetermined range, e.g., about 13.56 MHz to about 27.56 MHz. In a pulse mode (e.g., in which the RF bias supplies the susceptor 11 with a pulsed bias), the pulse frequency may be, for example, in the range of about 100 kHz to about 200 kHz, or another range. The wafer W may be adsorbed on the susceptor 11 by the electrostatic force generated by applying the direct current power to the susceptor 11. The susceptor 11 may be connected to a heater.

A treatment gas may be supplied into the chamber 10 from a gas supply source 25 connected to the chamber 10. The treatment gas may include, for example, a plasma excitation gas and an etching gas. The plasma excitation gas may include at least one of Ar, He, Ne, Kr, or Xe. The etching gas may include, for example, a CF-based etching source. For example, the CF-based etching source may include at least one of $CF_4$, $C_2F_6$, or $C_4F_8$. Selectively, the etching gas may further include an oxidizing gas, e.g., $O_2$, $CO_2$, or CO. The gas supply source 25 may be connected through a pipe 27 to a gas supply section 23 at an upper portion of the chamber 10. The gas supply section 23 may supply the treatment gas into the chamber 10 through the pipe 27.

The etching apparatus 1 may include the ICP antenna 30 installed on the chamber 10 to generate the inductively coupled plasma. Further, the etching apparatus 1 may include a RF power supply source 45 having a RF generator 42 and a matcher 40. The RF generator 42 may generate a RF power of, for example, about 13.56 MHz to about 27.56 MHz. The matcher 40 may transmit the RF power to the ICP antenna 30.

A dielectric window 31 may be under the ICP antenna 30 to seal the inside of the chamber 10. The dielectric window 31 may provide a transmittance path of the magnetic field generated around the ICP antenna 30. The dielectric window 31 may include, for example, quartz, ceramic, or alumina.

Referring to FIG. 11, the ICP antenna 30 may include, for example, an inner antenna segment 32 having a circular shape and an outer antenna segment 35 having a circular shape outside the inner antenna segment 32. The outer antenna segment 35 may be electrically connected to the inner antenna segment 32 in series. The outer antenna segment 35 may have a power end connected to the matcher 40 and a ground end connected to a power end of the inner antenna segment 32. A ground end of the inner antenna segment 32 may be grounded.

The inner antenna segment 32 may include a plurality of inner circular coils 33 and 34 electrically connected to each other in parallel. The outer antenna segment 35 may include a plurality of outer circular coils 36 and 37 electrically connected to each other in parallel.

The RF generator 42 may generate RF power to be applied to the power end of the outer antenna segment 35 through matcher 40. A magnetic field may be generated around the ICP antenna 30 based on current flowing along the inner and outer antenna segments 32 and 35. The magnetic field may ionize the treatment gas supplied into the chamber 10, and thus plasma may be produced in the chamber 10.

Referring to FIGS. 6A, 6B, and 10 to 12, the first etch process may be performed in the etching apparatus 1. The susceptor 11 may receive the RF bias in a pulsed manner. For example, the RF power may be applied to the susceptor 11 during a first duration ON when the RF bias is on and may not be applied to the susceptor 11 during a second duration OFF when the RF bias is off. The first duration ON may be maintained for a first time period T1. The second duration OFF may be maintained for a second time period T2. The first duration ON and the second duration OFF may be repeated cyclically and alternately. In one embodiment, T1 may be different from T2.

In one embodiment, the pulsed RF bias may have a duty ratio of about 20% to about 80% during the first etch process. The term "duty ratio" may correspond, for example, to a ratio of the first time period T1 to a sum of the first and second time periods T1 and T2, e.g., T1/(T1+T2).

As the RF power is applied during the first duration ON, the active patterns AP and the first insulation layer 120 may be etched at a relatively high etch rate when the first etch process is performed. At this time, the active patterns AP and first insulation layer 120 may be etched at substantially the same etch rate in the first duration ON.

Because the RF power is not applied during the second duration OFF, the active patterns AP and the first insulation layer 120 may be etched at a relatively low etch rate when the first etch process is performed. At this time, the first insulation 120 may have an etch rate greater than that of the active patterns AP in the second duration OFF. For example, the second duration OFF may enhance the etch selectivity of the first insulation layer 120 instead decreasing the etch rate of the first etch process.

According to exemplary embodiments, the pressure inside the chamber 10 may be set, for example, to about 5 mTorr during the first etch process. The RF bias 12 may have, for example, a frequency of about 13.56 MHz, a power of about 700 W, and a voltage of about 300V.

Referring to FIGS. 6A, 6B and 12, because the pulsed RF bias is applied during the first etch process, the fourth sidewall S4 may have a slope steeper than the third sidewall S3. This may be because an etch rate of the first insulation layer 120 may be greater than that of the active patterns AP during the first etch process. For example, during the first etch process, a ratio of an average etch rate of the first insulation layer 120 (e.g., a silicon oxide layer) to an average etch rate of the active patterns AP (e.g., silicon) may be, for example, about 1.0 to about 2.5.

Additionally, because the pulsed RF bias is applied during the first etch process, an etching time may increase. Thus, sizes of the second mask patterns MA may be reduced to a relatively greater extent during the first etch process.

Thus, due to the size reduction of the second mask patterns MA and the increase of the second angle θ2, the preliminary fin structure FSa may have a relatively reduced width W4 in the first direction D1. Therefore, it may be possible to prevent process defects, for example, as discussed with reference to FIGS. 13A and 13B.

Referring to FIGS. 13A and 13B, a second etch process may be performed on the resultant structure of FIGS. 5A and 5B. Differently from the first etch process discussed with reference to FIGS. 6A and 6B, the second etch process may be performed to apply a continuous waveform RF bias, which, for example, may be an RF bias applied under the condition that the first duration ON is held but the second duration OFF is skipped. For example, the RF bias may be continuously on in such a way that the RF power may be uninterruptedly applied during the second etch process. Therefore, the active patterns AP and the first insulation layer 120 may be etched at a relatively high etch rate at the second etch press compared with the first etch process.

Plasma ions may react with the exposed surfaces of the active patterns AP and the first insulation layer 120 during the second etch process. As a result, surface polymers may be formed. The surface polymers may include, for example, a volatile compound. When the surface polymers are desorbed, chemical etching may be performed on the active patterns AP and the first insulation layer 120. In case that the surface polymers are excessively formed, the surface polymers may interrupt a physical etching executed by plasma cations. The second etch process may be performed at high speed without breaking. Thus, an acting action may be continuously performed under the condition that the surface polymers are not sufficiently desorbed yet. As a result, the second etch process may be performed at a relatively high etch rate but may form a gentle slope in an etch profile.

For example, each of the preliminary fin structures FSa formed by the second etch process may include the third sidewall S3 extending in the first direction D1 and the fourth sidewall S4 extending in the second direction D2. The third sidewall S3 may be inclined relative to the top surface of the substrate 100 at a fourth angle θ4. The fourth sidewall S4 may be inclined relative to the top surface of the substrate 100 at a fifth angle θ5. The fourth angle θ4 may be greater than the first angle θ1 (e.g., explained with reference to FIGS. 6A and 6B) and the fifth angle θ5 may be greater than the second angle θ2 (e.g., explained with reference to FIGS. 6A and 6B).

Because the second etch process is performed at a relatively high speed, the sizes of the second mask patterns MA may not be significantly reduced, but may remain. Since the sizes of the second mask patterns MA remain substantially the same and the etch profile is formed to have the gentle slope, the preliminary fin structure FSa may be formed to have a relatively increased width W5 extending in the first direction D1. For example, the width W5 of the preliminary fin structure FSa formed during the second etch process may be greater than the width W3 of the second mask pattern MA. Therefore, a dummy pattern DP may be formed while the active pattern AP is not completely removed, but partially remains. Thus, differently from the preliminary fin structure FSa discussed with reference to FIGS. 6A and 6B, the preliminary fin structure FSa may further include the dummy pattern DP, which may induce one or more defects in a subsequent process.

As the ratio of the maximum length L1 to the maximum width W1 of the fin structures FS decreases (e.g., about 3.5 to about 5), for example, as discussed with reference to FIGS. 1 to 3, an etch skew may become more severe during the second etch process. Therefore, the etch profile may deteriorate so that the width W5 of the preliminary fin structure FSa becomes relatively greater. Thus, when forming a fin structure having a relatively small ratio of L1 to W1, it may be possible to form a fin structure having a process defect such as the dummy pattern DP.

In some embodiments, because the first etch process may improve the etch profile, it may be advantageous to reduce or minimize process defects caused by the etch skew. Thus, in at least one embodiment, the first process may form the fin structure FS to have a relatively small ratio of L1 to W1 without process defects.

Figure 7A:
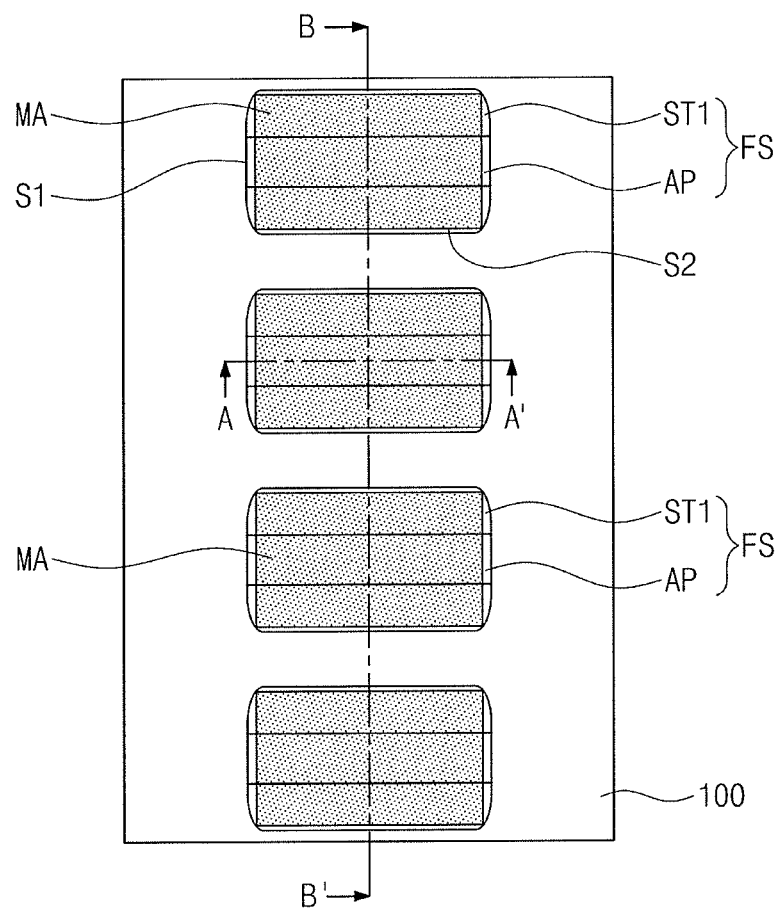
Figure 7B:
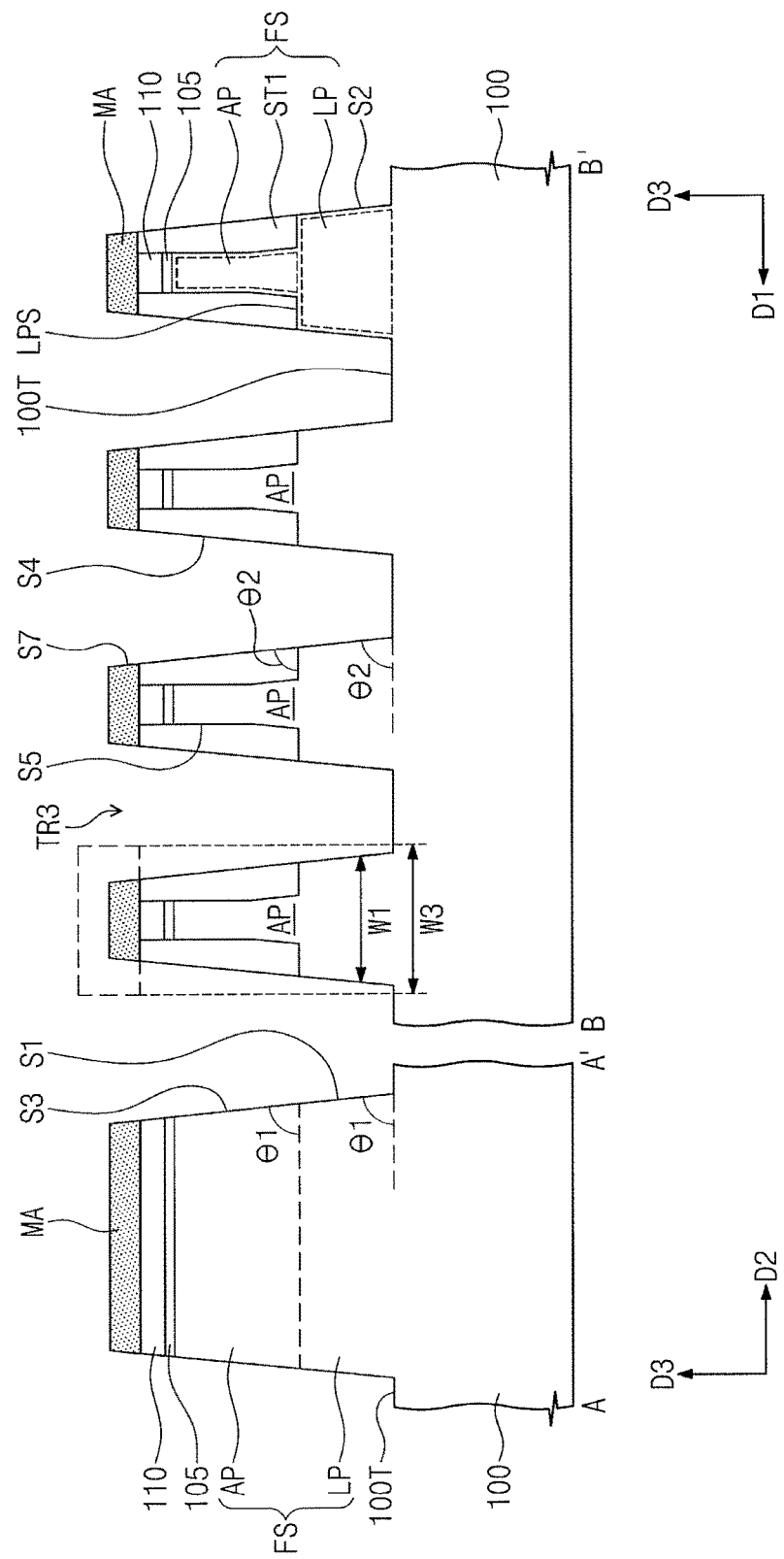

Referring to FIGS. 7A and 7B, a third etch process may be performed to form fin structures FS and a third trench TR3 defining the fin structures FS. The third etch process may include etching an exposed upper portion of the substrate 100 (e.g., a floor of the second trench TR2) using remaining second mask patterns MA as an etch mask. Therefore, the upper portion of the substrate 100 may be patterned to form lower patterns LP. The lower patterns LP may respectively constitute lower portions of the fin structures FS. The formation of the third trench TR3 may include etching the second trench TR2 more deeply.

A top surface of each of the lower patterns LP may include flat portions LPS. A portion of the top surface 100T of the substrate 100, previously discussed with reference to FIGS. 6A and 6B, may be protected by the first device isolation patterns ST1. Thus, the flat portions LPS may be formed. The first device isolation patterns ST1 may therefore directly cover the flat portions LPS.

The third etch process may be performed along the etch profile formed by the first etch process. For example, each of the lower patterns LP may include a first sidewall S1 extending in the first direction D1 and a second sidewall S2 extending in the second direction D2. The first sidewall S1 of the lower pattern LP may be aligned with the third sidewall S3 of the active pattern AP. The second sidewall S2 of the lower pattern LP may be aligned with the fourth sidewall S4 of the first device isolation pattern ST1. The first sidewall S1 may be inclined to the top surface 100T of the substrate 100 at an angle substantially the same as the first angle θ1. The second sidewall S2 may be inclined to the top surface 100T of the substrate 100 at an angle substantially the same as the second angle θ2.

The third etch process may be carried out in the etching apparatus 1, for example, discussed with reference to FIGS. 10 and 11. For example, after the first etch process is done, the third etch process may be performed under the situation where the wafer W is held in the chamber 10. The third etch process may be performed under process conditions substantially the same as the first etch process. In one embodiment, the third etch process may be performed under process conditions different from the first etch process.

For example, the third etch process may be performed using an etch recipe that includes a selective etching of the substrate 100, e.g., silicon. In this case, the continuous waveform RF bias may be applied during the third etch process. The third etch process may use a treatment gas including an HBr-containing etching gas and an $O_2$-containing oxidizing gas. Referring back to FIGS. 10 and 11, the pressure inside the chamber 10 may be set to about 35 mTorr during the third etch process. The RF bias 12 may have a frequency of about 13.56 MHz, a power of about 500 W, and a voltage of about 300V.

Figure 8A:
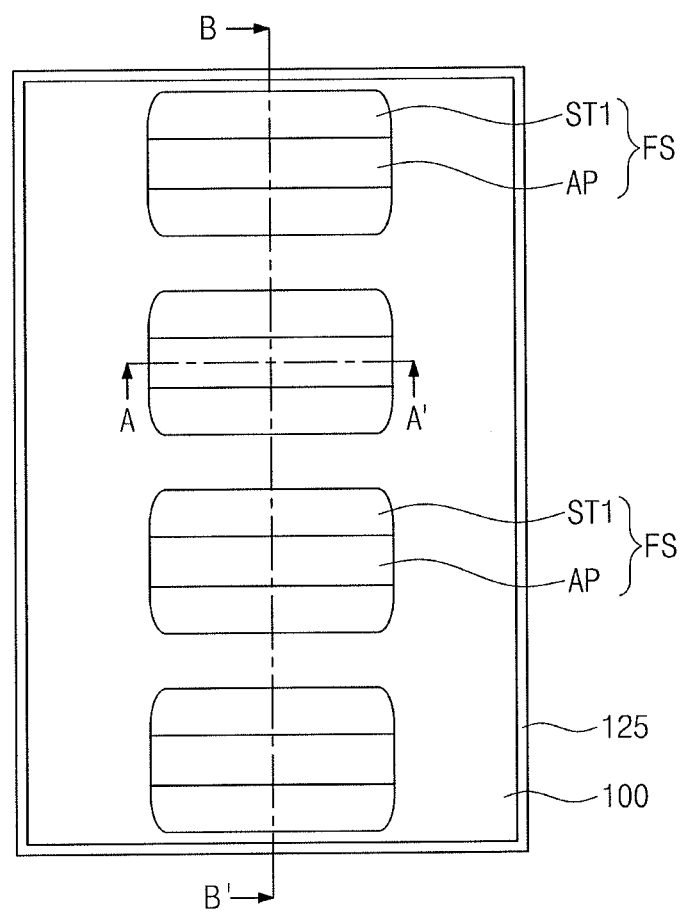
Figure 8A:
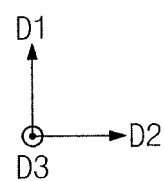
Figure 8B:
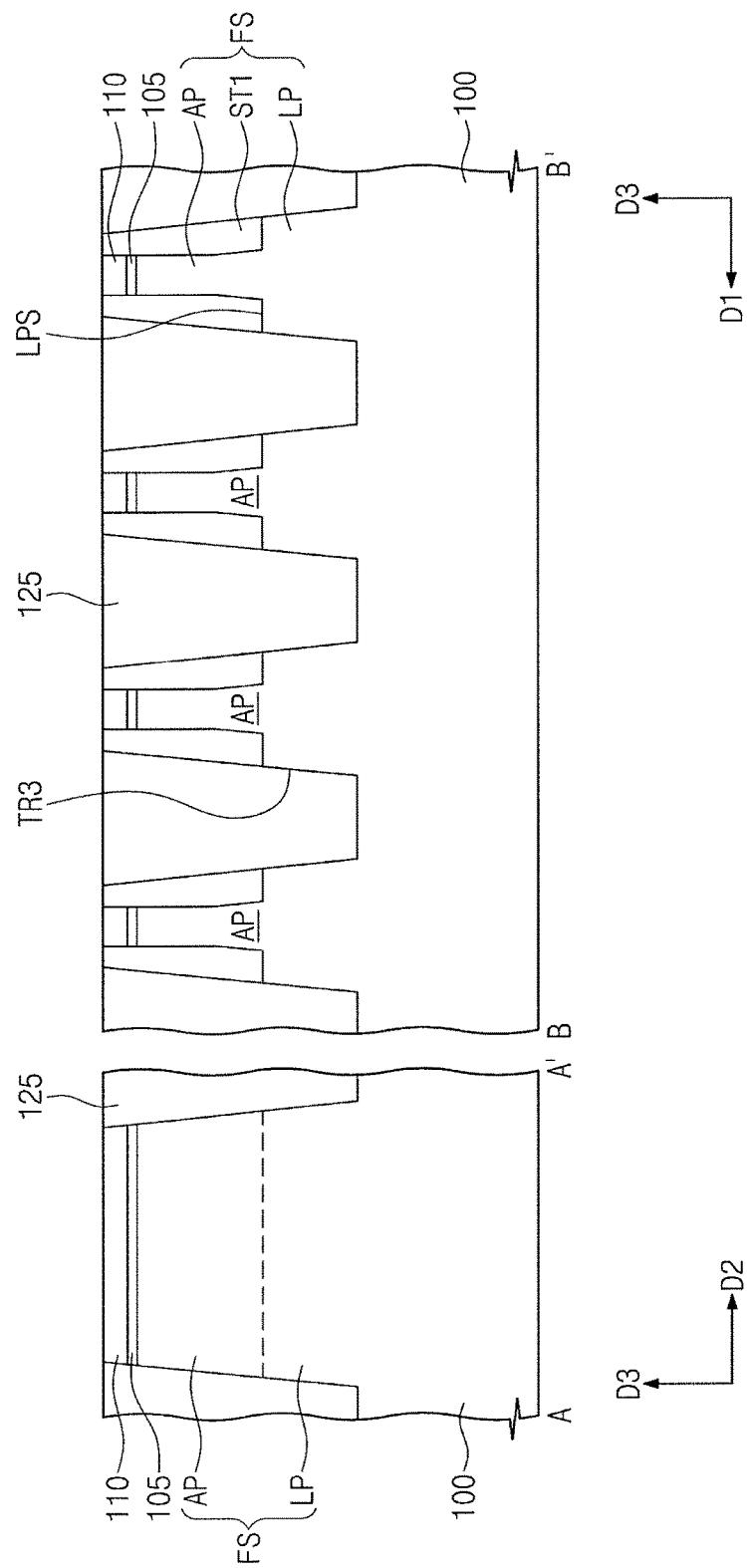

Referring to FIGS. 8A and 8B, the second mask patterns MA may be removed. Thereafter, a second insulation layer 125 may be formed to fill the third trench TR3. The second insulation layer 125 may be formed to expose top surfaces of the first mask patterns 110. The second insulation layer 125 may include, for example, a silicon oxide layer. The second insulation layer 125 may include, for example, an HDP (high density plasma) oxide, TEOS (tetraethylorthosilicate), PE-TEOS (plasma enhanced tetraethylorthosilicate), O3-TEOS (O3-tetraethylorthosilicate), USG (undoped silicate glass), PSG (phosphosilicate glass), BSG (borosilicate glass), BPSG (borophosphosilicate glass), FSG (fluoride silicate glass), SOG (spin on glass), or any combination thereof. Formation of the second insulation layer 125 may include, for example, depositing an insulative layer and then planarizing the insulative material until the first mask patterns 110 are revealed.

Figure 9A:
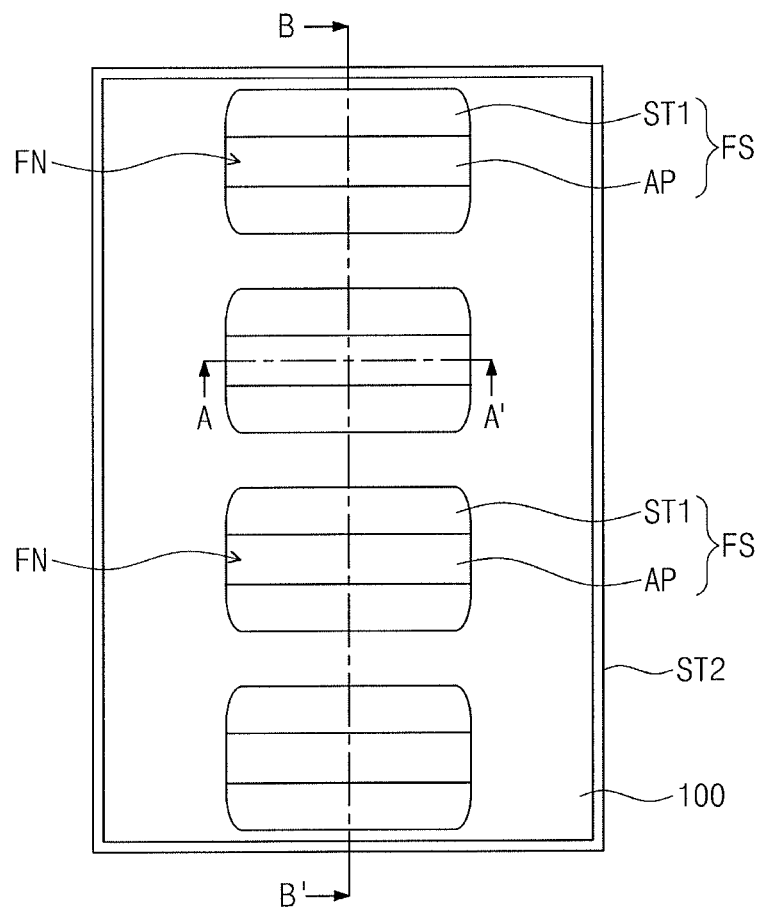
Figure 9B:
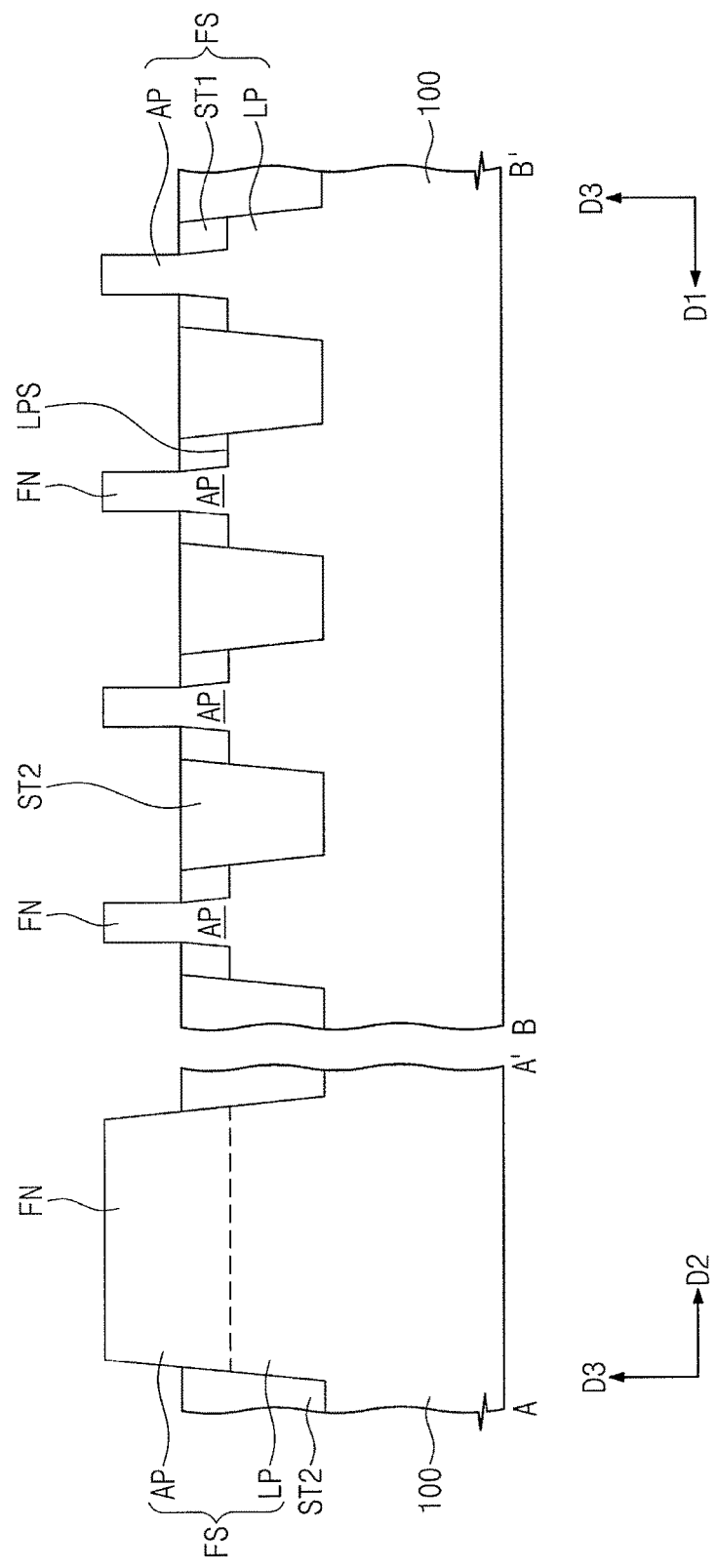

Referring to FIGS. 9A and 9B, remaining first mask patterns 110 may be removed. Thereafter, an upper portion of the second insulation layer 125 may be removed to form a second isolation pattern ST2. When the upper portion of the second insulation layer 125 is removed, the buffer patterns 105 and upper portions of the first device isolation patterns ST1 may be simultaneously removed to expose upper portions FN of the active patterns AP. For example, a dry etch process may be performed to remove the upper portion of the second insulation layer 125, the upper portions of the first device isolation patterns ST1, and the buffer patterns 105. The dry etch process may have an etch selectivity, for example, with respect to a silicon nitride layer.

Referring back to FIGS. 1, 2, and 3, an interlayer dielectric layer 130 may be formed to cover the upper portions FN of the active patterns AP, the first device isolation patterns ST1, and the second device isolation patterns ST2. Contact plugs CNT may be formed to penetrate the interlayer dielectric layer 130, and thus the contact plugs CNT may be respectively connected to the upper portions FN of the active patterns AP. The contact plugs CNT may be formed, for example, by forming contact holes that penetrate the interlayer dielectric layer 130 to expose the upper portions FN of the active patterns AP, and then filling the contact holes with a conductive material. The conductive material may include, for example, at least one of doped semiconductor, conductive metal nitride (e.g., titanium nitride, tantalum nitride, etc.), and metal (e.g., aluminum, tungsten, etc.).

Figure 14:
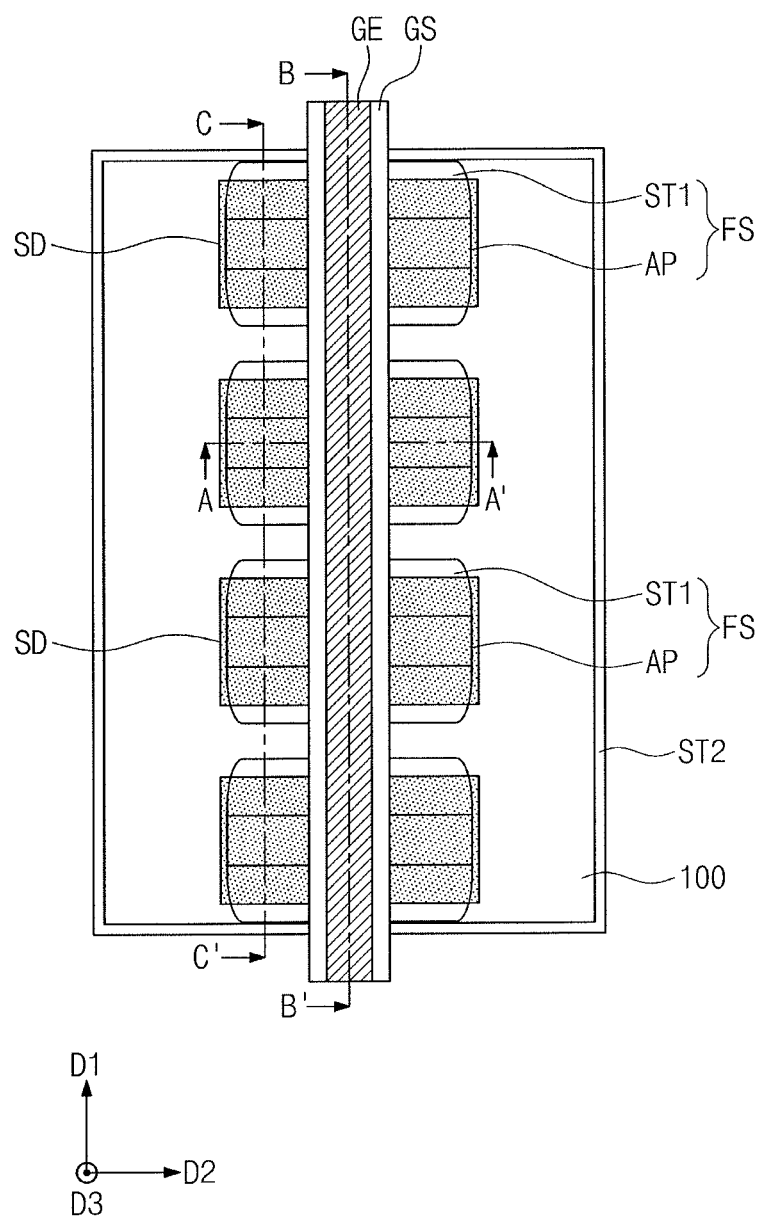
FIG. 14 illustrates another embodiment of a semiconductor device.
Figure 15A:
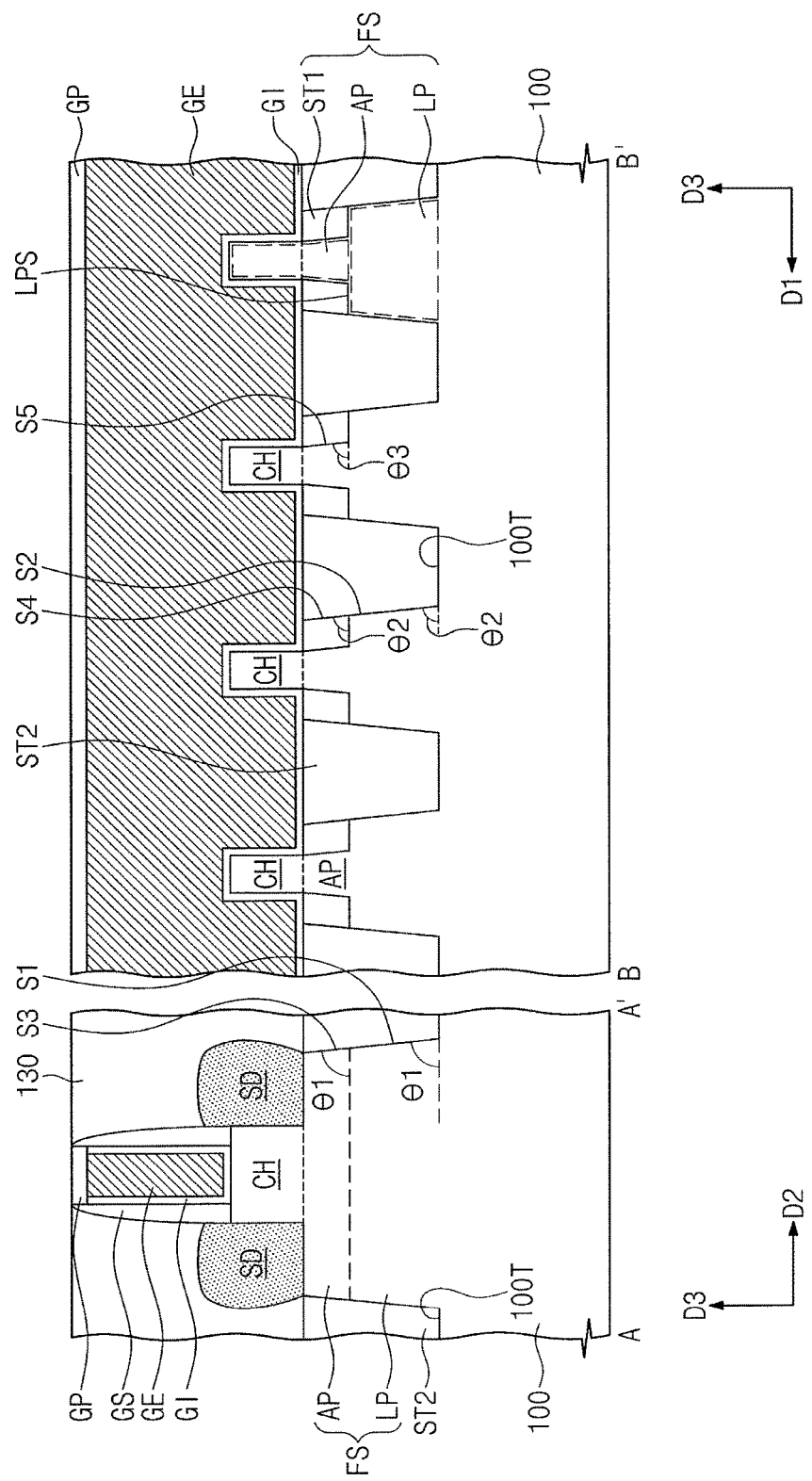
FIG. 15A illustrates a view taken along section lines A-A' and B-B' in FIG. 14.
Figure 15B:
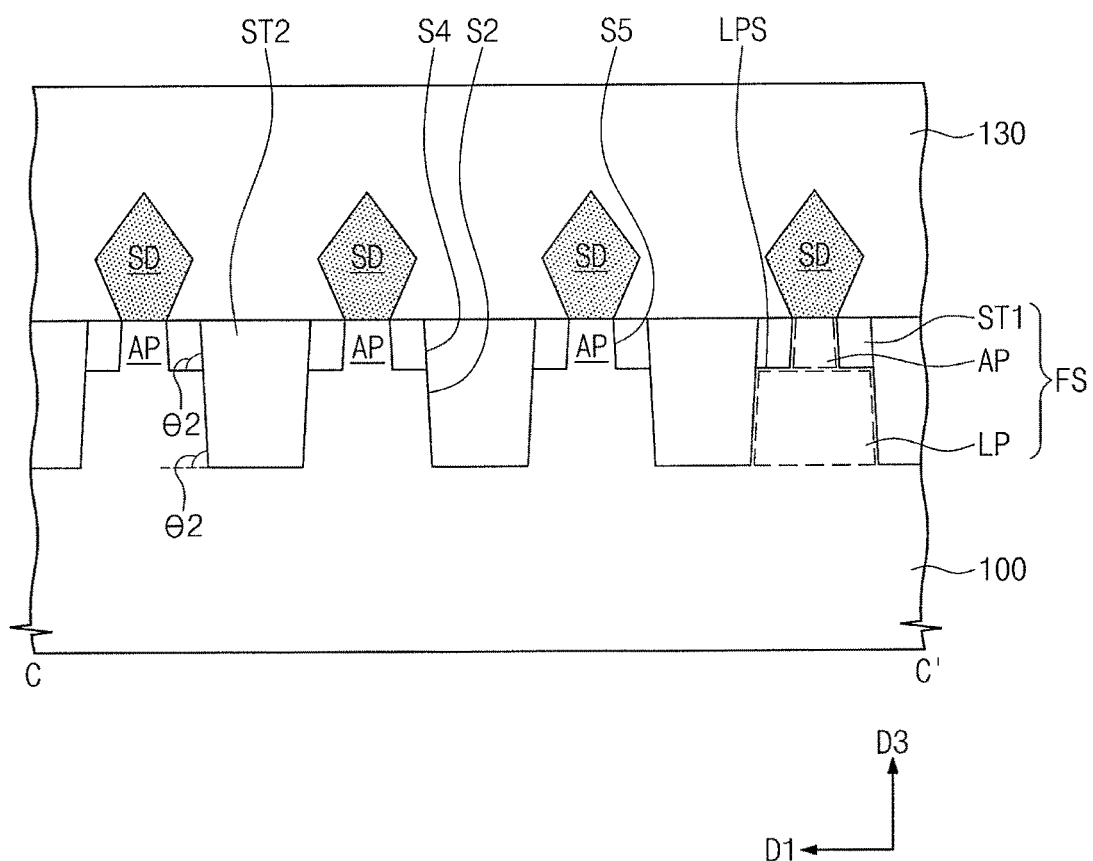
FIG. 15B illustrates a view taken along section line C-C' in FIG. 14.

FIG. 14 illustrates another embodiment of a semiconductor device. FIG. 15A is a cross-sectional view taken along lines A-A' and B-B' in FIG. 14. FIG. 15B is a cross-sectional view taken along line C-C' in FIG. 14.

Referring to FIGS. 14, 15A and 15B, a plurality of fin structures FS are on a region of a substrate 100. The region of the substrate 100 may be a portion of memory cell region on which a plurality of memory cells are formed to store data. For example, the portion of substrate 100 may be provided with memory cell transistors constituting a predetermined number SRAM cells, each including six transistors. The portion of the substrate 100 may be a portion of logic cell region including logic transistors that form a logic circuit of a semiconductor device. For example, the portion of the substrate 100 may be a region including logic transistors of a processor core or I/O terminals.

Each of the fin structures FS may include a lower pattern LP, an active pattern AP that vertically protrudes from a top surface of the lower pattern LP, and a pair of first device isolation patterns ST1 that cover opposing sidewalls S5 of the active patterns AP. A second isolation pattern ST2 may fill a trench between the fin structures FS.

A gate electrode GE may be formed on the active pattern AP. The gate electrode GE may extend in a first direction D1 to run across a plurality of the active patterns AP arranged along the first direction D1. The gate electrode GE may cover top surfaces and sidewalls of the active patterns AP. The gate electrode GE may extend in the first direction D1 across all of the first and second device isolation patterns ST1 and ST2.

A gate dielectric pattern GI may be between the active patterns AP and the gate electrode GE. Gate spacers GS may be on opposing sides of the gate electrode GE. A capping pattern GP may cover a top surface of the gate electrode GE. The gate dielectric pattern GI may directly cover a top portion of each of the active patterns AP, e.g., directly cover a channel region CH. The gate dielectric pattern GI may be between the gate electrode GE and the gate spacers GS. The gate dielectric pattern GI may horizontally extend along the gate electrode GE and partially directly cover top surfaces of the first and second device isolation patterns ST1 and ST2.

The gate electrode GE may include, for example, at least one of doped semiconductor, conductive metal nitride (e.g., titanium nitride, tantalum nitride, etc.), or metal (e.g., aluminum, tungsten, etc.). The gate dielectric patterns GI may include at least one of a silicon oxide layer, a silicon oxynitride layer, or a high-k dielectric layer (e.g. hafnium oxide, hafnium silicate, zirconium oxide, or zirconium silicate) with dielectric constant greater than that the silicon oxide layer. Each of the capping patterns GP and the gate spacers GS may include at least one of a silicon oxide layer, a silicon nitride layer, or a silicon oxynitride layer. Hereinafter, a single fin structure FS will be discussed for convenience.

A pair of source/drain patterns SD may be provided on an upper portion of the active pattern AP and on opposing sides of the gate electrode GE. The source/drain patterns SD may have n-type conductivity or p-type conductivity.

The upper portion of the active pattern AP may include a channel region CH between the source/drain patterns SD. The channel region CH may be below the gate electrode GE and thus may vertically overlap the gate electrode GE.

Each of the source/drain patterns SD may be, for example, an epitaxial pattern formed using an underlying active pattern AP as a seed layer. When the source/drain patterns SD have n-type conductivity, the source/drain patterns SD may include a material that provides the channel region CH with a tensile strain. For example, when the substrate 100 is a silicon substrate, the source/drain patterns SD may include a SiC layer having a lattice constant less than that of Si or a Si layer having lattice constant substantially equal to that of the substrate 100. When the source/drain patterns SD have p-type conductivity, the source/drain patterns SD may include a material that provides the channel region CH with compressive strain. For example, when the substrate 100 is a silicon substrate, the source/drain patterns SD may include a SiGe layer having a lattice constant greater than that of Si.

An interlayer dielectric layer 130 may be formed on the substrate 100 to cover the gate electrode GE, the source/drain patterns SD, and the first and second device isolation patterns ST1 and ST2. The interlayer dielectric layer 130 may have a top surface coplanar with top surfaces of the capping patterns GP. Source/drain contacts may be provided on opposing sides of the gate electrode GE. The source/drain contacts may penetrate the interlayer dielectric layer 130 and may be electrically connected to the source/drain patterns SD.

Figure 16A:
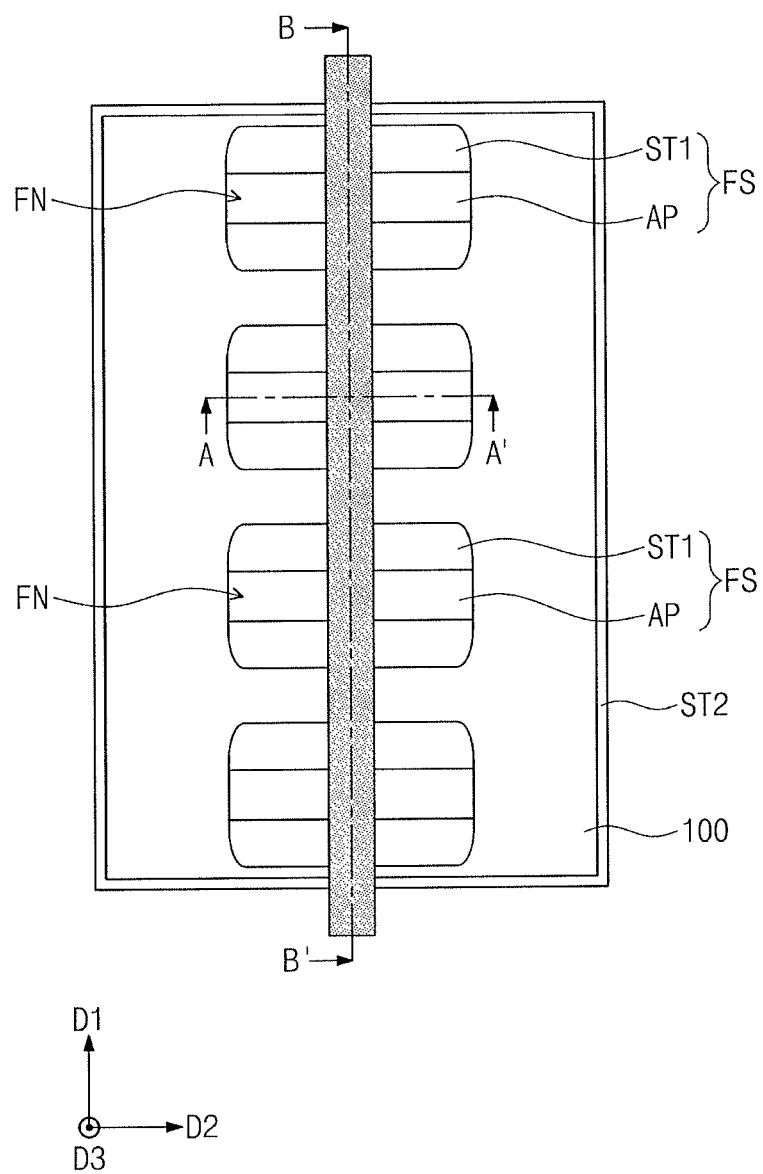
FIGS. 16A and 17A illustrate another embodiment of a method for manufacturing a semiconductor device.
Figure 16B:
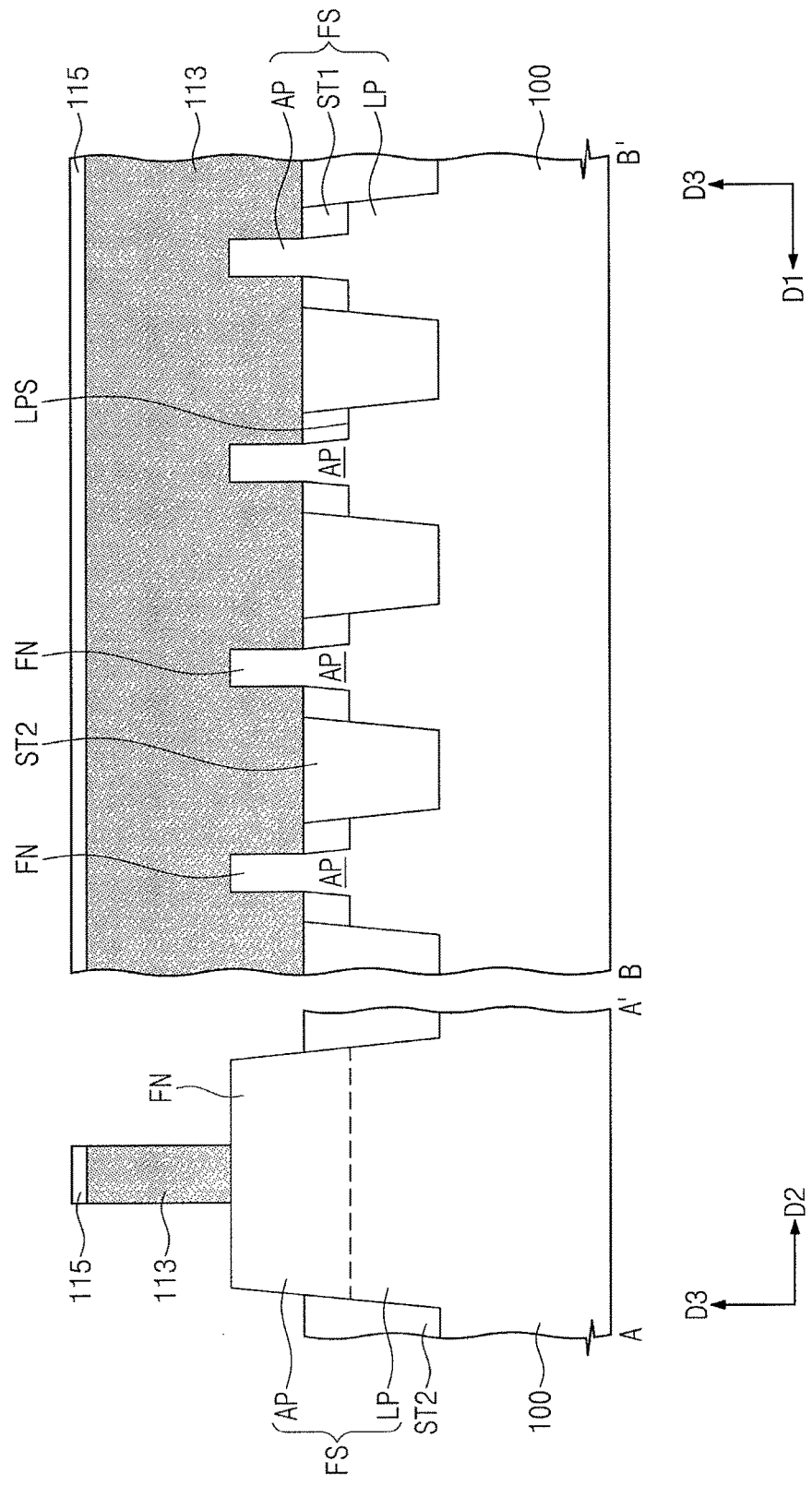
FIGS. 16B and 17B illustrate views taken along section lines A-A' and B-B' in FIGS. 16A and 17A, respectively.
Figure 17A:
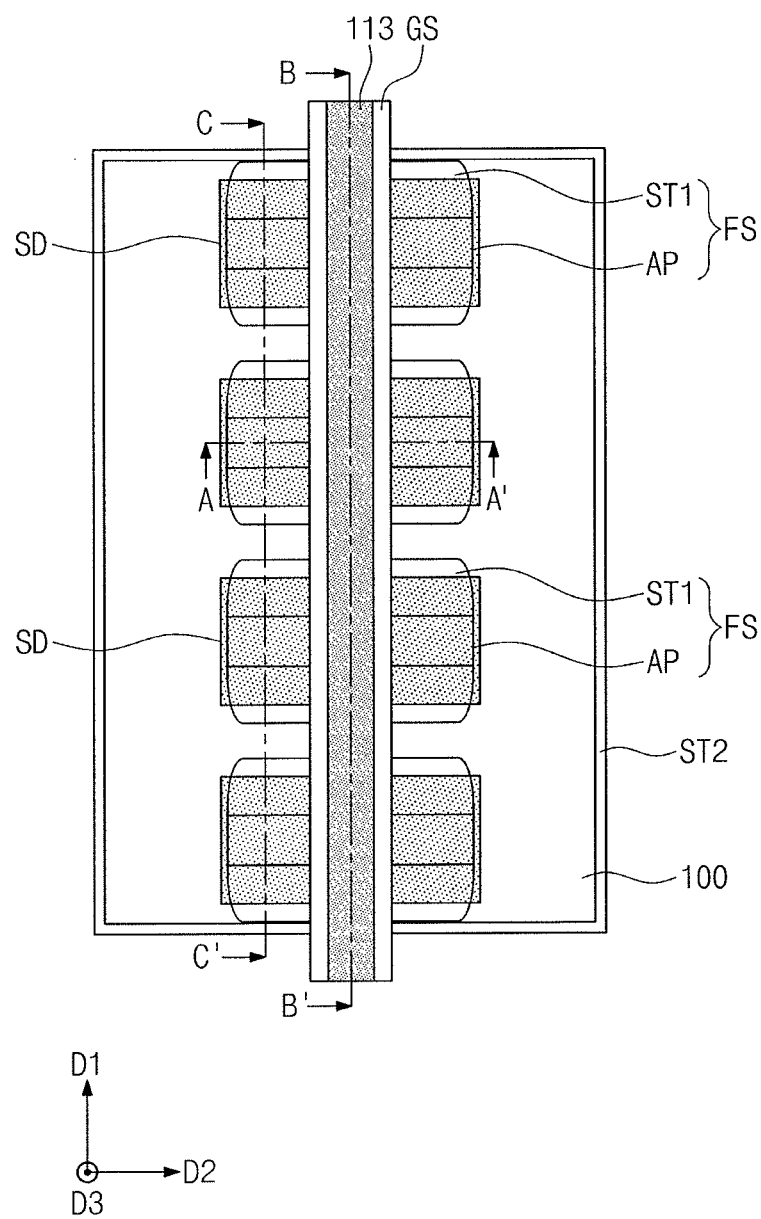
Figure 17B:
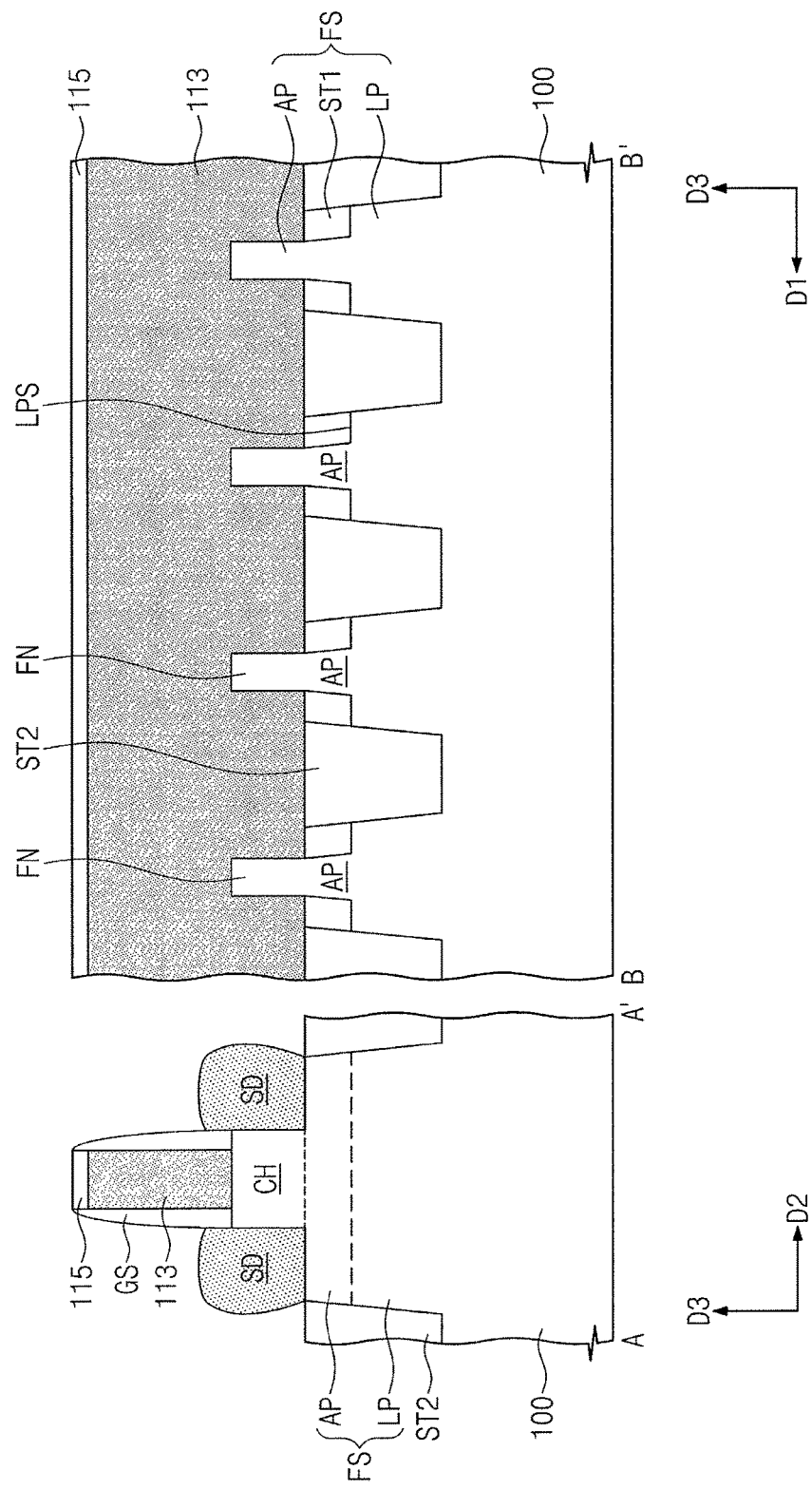
Figure 17C:
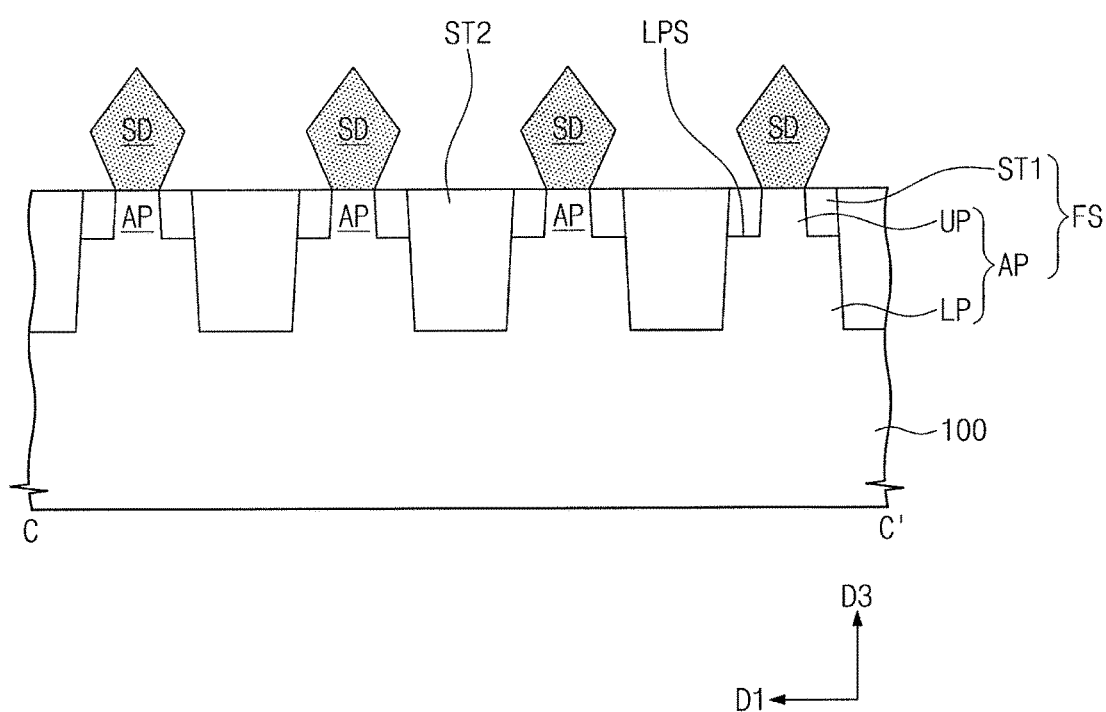
FIG. 17C illustrates a view taken along section line C-C' in FIG. 17A.

FIGS. 16A and 17A illustrate another embodiment of a method for manufacturing a semiconductor device. FIGS. 16B and 17B are cross-sectional views taken along lines A-A' and B-B' in FIGS. 16A and 17A, respectively. FIG. 17C is a cross-sectional view taken along line C-C' in FIG. 17A.

Referring to FIGS. 16A and 16B, a sacrificial gate pattern 113 and a gate mask pattern 115 are formed on the resultant structure of FIGS. 9A and 9B. The sacrificial gate pattern 113 may be formed to run across in the first direction D1 on the upper portions FN of the active patterns AP. The sacrificial gate pattern 113 may cover the upper portions FN of the active patterns AP and may extend onto the first and second device isolation patterns ST1 and ST2.

Formation of the sacrificial gate pattern 113 and the gate mask pattern 115 may include sequentially forming a sacrificial gate layer and a gate mask layer on the upper portions FN of the active patterns AP and sequentially patterning the gate mask layer and the sacrificial gate layer. The sacrificial gate layer may include, for example, a polysilicon layer. The gate mask layer may include, for example, a silicon nitride layer or a silicon oxynitride layer.

Referring to FIGS. 17A and 17B, a pair of gate spacers GS may be formed to cover opposing sidewalls of the sacrificial gate pattern 113. The gate spacers GS may be formed by forming on the substrate 100 a gate spacer layer that conformally covers the sacrificial gate pattern 113 and then anisotropically etching the gate spacer layer. The gate spacer layer may include, for example, at least one of a silicon oxide layer, a silicon nitride layer, or a silicon oxynitride layer. The gate spacer layer may be formed, for example, by a deposition process such as but not limited to a chemical vapor deposition (CVD) or an atomic layer deposition (ALD).

The upper portions FN of the active patterns AP may be removed from opposing sides of the sacrificial gate pattern 113. The upper portions FN of the active patterns AP may be removed, for example, by selectively etching exposed upper portions FN of the active patterns AP using the gate mask pattern 115 and the gate spacers GS as an etch mask. The etch process for removing the upper portions FN of the active patterns AP may include a dry etch process and/or a wet etch process.

Thereafter, source/drain patterns SD may be formed on opposing sides of the sacrificial gate pattern 113. The source/drain patterns SD may be formed, for example, by a selective epitaxial growth process using the active patterns AP as a seed layer.

Remaining upper portions of the active patterns AP may constitute channel regions CH. The source/drain regions SD may be formed to induce tensile strain or compressive strain exerted on the channel regions CH. The source/drain patterns SD may be doped with n-type or p-type impurities at the same time or after the selective epitaxial growth process is performed.

Referring back to FIGS. 14, 15A and 15B, the interlayer dielectric layer 130 may be formed on the substrate 100. The interlayer dielectric layer 130 may be include, for example, a silicon oxide layer. A planarization process may be performed on the interlayer dielectric layer 130 until top surfaces of the sacrificial gate patterns 113 are revealed. The planarization process may include, for example, an etch-back process and/or a chemical mechanical polishing (CMP) process. When the planarization process is performed on the interlayer dielectric layer 130, the gate mask pattern 115 may be removed together with the interlayer dielectric layer 130.

The sacrificial gate pattern 113 may be replaced with the gate electrode GE. For example, the exposed sacrificial gate pattern 113 may be selectively removed to form a gap between the gate spacers GS. Channel regions CH may be exposed through the gap.

A gate dielectric layer may be formed to partially fill the gap. The gate dielectric layer may be formed to cover the channel regions CH. The gate dielectric layer may include, for example, at least one of a silicon oxide layer, a silicon oxynitride layer, or a high-k dielectric layer having a dielectric constant greater than that of the silicon oxide layer. A gate conductive layer may be formed on the gate dielectric layer to completely fill the gap. For example, the gate conductive layer may include at least one of doped semiconductor, conductive metal nitride, or metal. The sequentially stacked gate dielectric and conductive layers may be planarized to form the gate dielectric pattern GI and the gate electrode GE in the gap.

Thereafter, the gate dielectric pattern GI and the gate electrode GE in the gap may be partially recessed to form the capping pattern GP on the gate electrode GE. For example, the capping pattern GP may include at least one of a silicon oxide layer, a silicon nitride layer, or a silicon oxynitride layer.

Source/drain contacts may be formed on opposing sides of the gate electrode GE. For example, contact holes may be formed to penetrate the interlayer dielectric layer and expose the source/drain patterns SD. The contact holes may then be filled with a conductive material to form the source/drain contacts in the contact holes.

Figure 18:
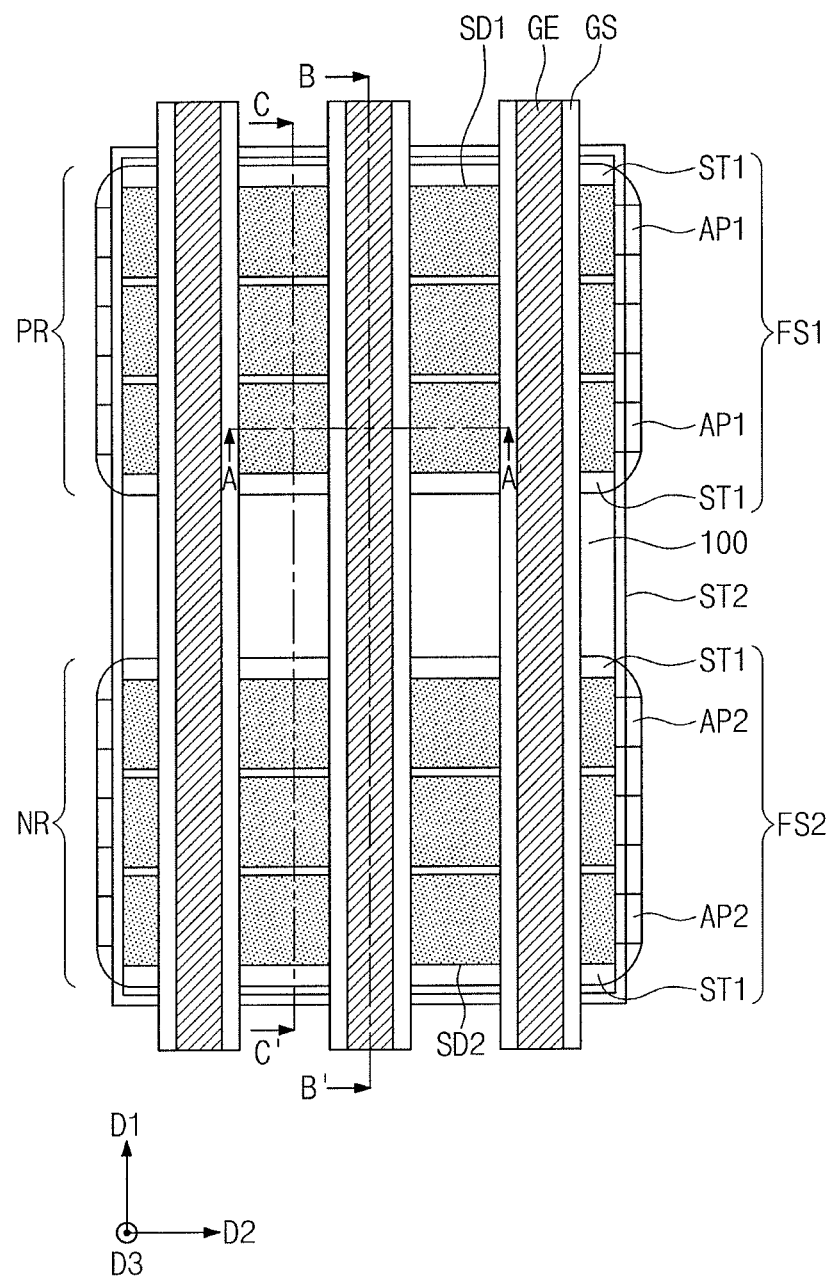
FIG. 18 illustrates another embodiment of a semiconductor device.
Figure 19A:
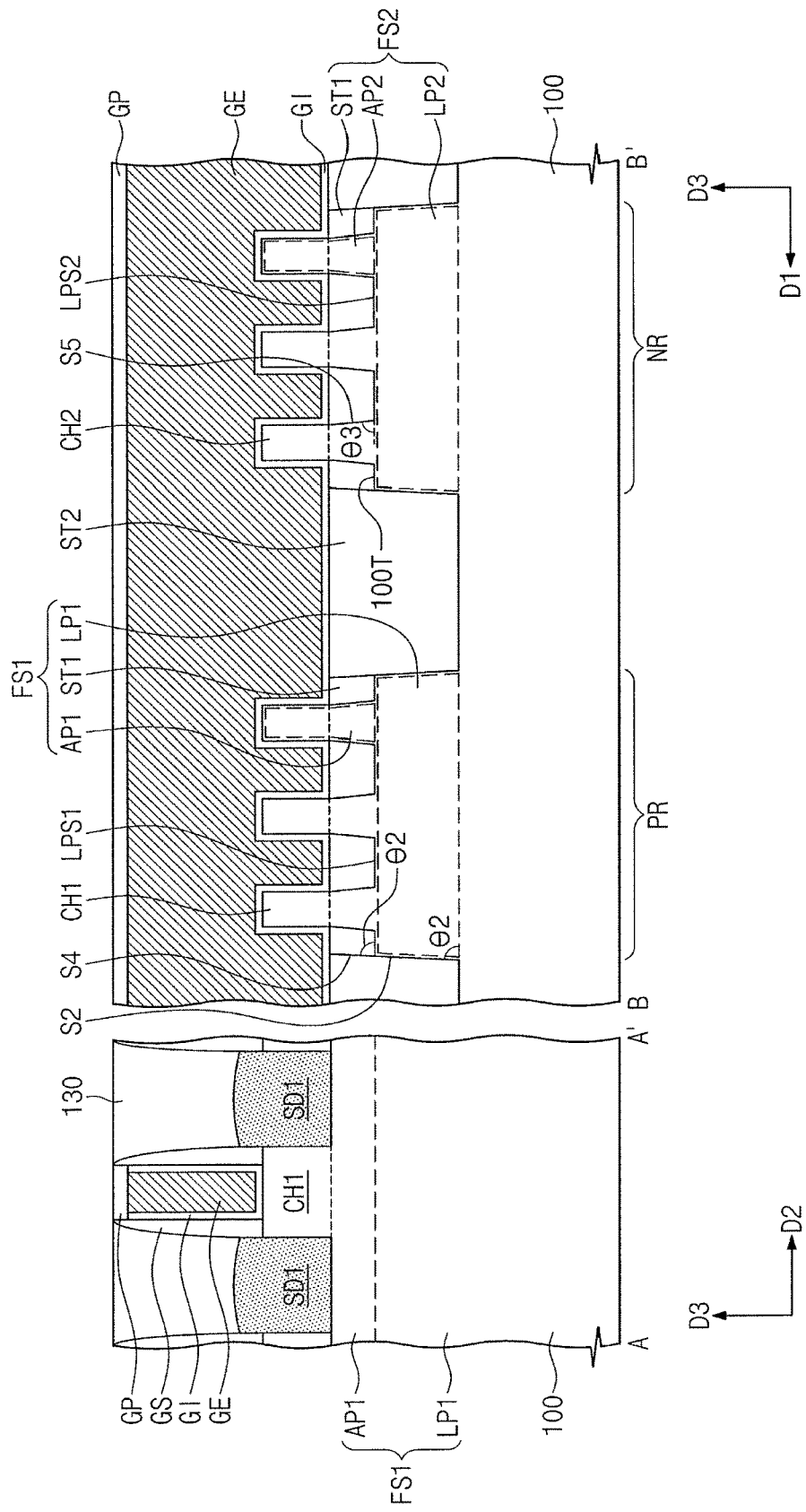
FIG. 19A illustrates a view taken along section lines A-A' and B-B' in FIG. 18.
Figure 19B:
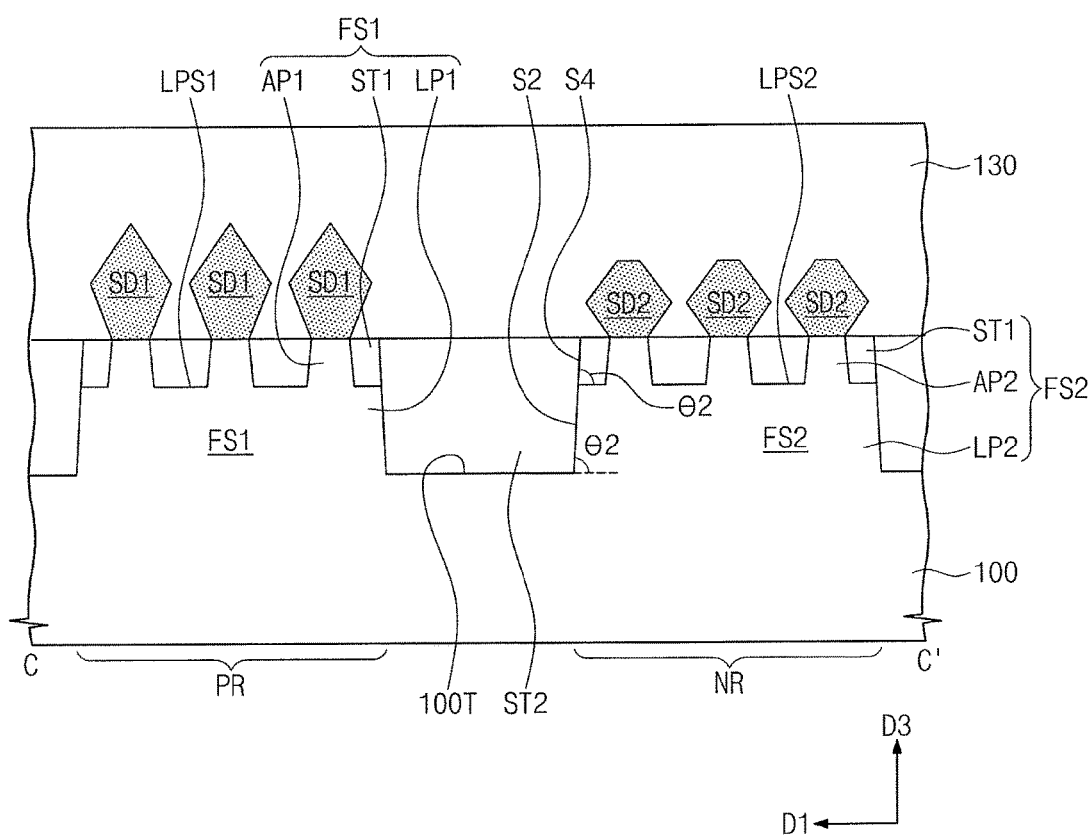
FIG. 19B illustrates a view taken along section line C-C' in FIG. 18.

FIG. 18 illustrates another embodiment of a semiconductor device, FIG. 19A is a cross-sectional view taken along lines A-A' and B-B' in FIG. 18, and FIG. 19B is a cross-sectional view taken along line C-C' in FIG. 18.

Referring to FIGS. 18, 19A and 19B, a substrate 100 includes an NMOSFET region NR and a PMOSFET region PR. The NMOSFET region NR may be an active region on which an n-type transistor is disposed. The PMOSFET region PR may be an active region on which a p-type transistor is disposed. The NMOSFET region NR and the PMOSFET region PR may be arranged in a first direction D1. A second device isolation pattern ST2 separates the NMOSFET region NR from the PMOSFET region PR. The NMOSFET region NR and the PMOSFET region PR may a portion of a logic circuit in a logic cell region of a semiconductor device.

A first fin structure FS1 may be on the PMOSFET region PR. A second fin structure FS2 may be on the NMOSFET region NR. The first fin structure FS1 and second fin structure FS2 may vertically protrude from the substrate 100.

The first fin structure FS1 may include a first lower pattern LP1, a plurality of first active patterns AP1 that vertically protrude from a top surface of the first lower pattern LP1, and a plurality of first device isolation patterns ST1 respectively covering opposing sidewalls S5 of each of the first active patterns AP1. Thus, differently from the fin structure FS in FIGS. 1, 2, 3, 14, 15A, and 15B, the first fin structure FS1 includes the first active patterns AP1 on a single one of the first lower patterns LP1.

The first lower pattern LP1 may include first flat portions LPS1 on opposing sides of each of the first active patterns AP1. Thus, as shown in FIG. 19A or 19B, each of the first active patterns AP1 may be between the first flat portions LPS1.

The first lower pattern LP1 may include a second sidewall S2 extending in a second direction D2. The second sidewall S2 may be inclined relative to the top surface 100T of the substrate 100 at a second angle θ2. The first device isolation pattern ST1 adjacent to the second sidewall S2 may include a fourth sidewall S4 extending in the second direction D2. The fourth sidewall S4 may be inclined relative to the top surface 100T of the substrate 100 at the second angle θ2. Thus, the fourth sidewall S4 may be aligned with the second sidewall S2. The second angle θ2 may be, for example, in the range of about 85° to about 90°.

The first fin structure FS1 may have an end substantially the same as or similar to that of the fin structure FS in FIGS. 14, 15A, and 15B. Thus, at the end of the first fin structure FS1, the first lower pattern LP1 may include a first sidewall S1 extending in the first direction D1, and each of the first patterns AP1 may include a third sidewall S3 extending in the first direction D1 (see, e.g., FIG. 15A).

The second fin structure FS2 may include a second lower pattern LP2, a plurality of second active patterns AP2 that vertically protrude from a top surface of the first lower pattern LP1, and a plurality of first device isolation patterns ST1 respectively covering opposing sidewalls S5 of each of the second active patterns AP2. The second fin structure FS2 may be, for example, substantially the same as or similar to that of the first fin structure FS1.

A plurality of gate electrodes GE may be on the first and second active patterns AP1 and AP2. The gate electrodes GE may extend in the first direction D1 crossing longitudinal directions of the first and second active patterns AP1 and AP2. The gate electrodes GE may be spaced apart from each other in the second direction D2. A gate dielectric pattern GI may be between each of the first and second active patterns AP and each of the gate electrodes GE. Gate spacers GS may be on opposing sides of each of the gate electrodes GE. A capping pattern GP may cover the top surface of each of the gate electrodes GE.

First source/drain patterns SD1 may be on upper portions of the first active patterns AP1 between the gate electrodes GE. Second source/drain patterns SD2 may be on upper portions of the second active patterns AP2 between the gate electrodes GE.

The first source/drain patterns SD1 may have a p-type conductivity, and the second source/drain patterns SD2 may have an n-type conductivity. For example, the first source/drain patterns SD1 may include a SiGe layer and the second source/drain patterns SD2 may include a Si layer or a SiC layer. The first and second source/drain patterns SD1 and SD2 may be formed, for example, by individual epitaxial growth processes using different materials. Thus, the first and second source/drain patterns SD1 and SD2 may have different sectional profiles (see, e.g., FIG. 19B).

An interlayer dielectric layer 130 may be formed on the substrate 100 to cover the gate electrodes GE, the first and second source/drain patterns SD1 and SD2, and the first and second device isolation patterns ST1 and ST2. Source/drain contacts may be between the gate electrodes GE. The source/drain contacts may penetrate the interlayer dielectric layer 130 and be electrically connected to the first and second source/drain patterns SD1 and SD2.

FIGS. 20A, 21A, 22A, 23A, 24A, 25A, and 26A illustrate another embodiment of a method for manufacturing a semiconductor device. FIGS. 20B, 21B, 22B, 23B, 24B, 25B, and 26B are cross-sectional views taken along lines A-A' and B-B' in FIGS. 20A, 21A, 22A, 23A, 24A, 25A, and 26A, respectively. FIG. 26C is a cross-sectional view taken along line C-C' in FIG. 26A.

Figure 20A:
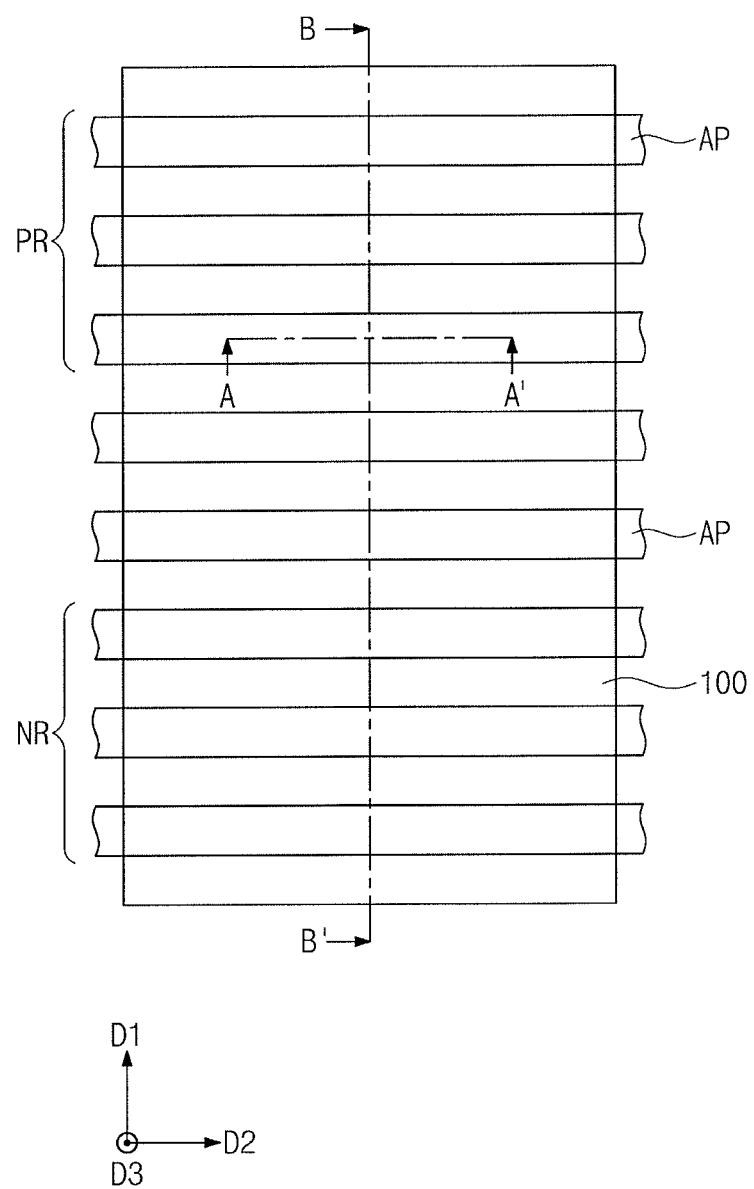
FIGS. 20A, 21A, 22A, 23A, 24A, 25A, and 26A illustrate another embodiment of a method for manufacturing a semiconductor device.
Figure 20B:
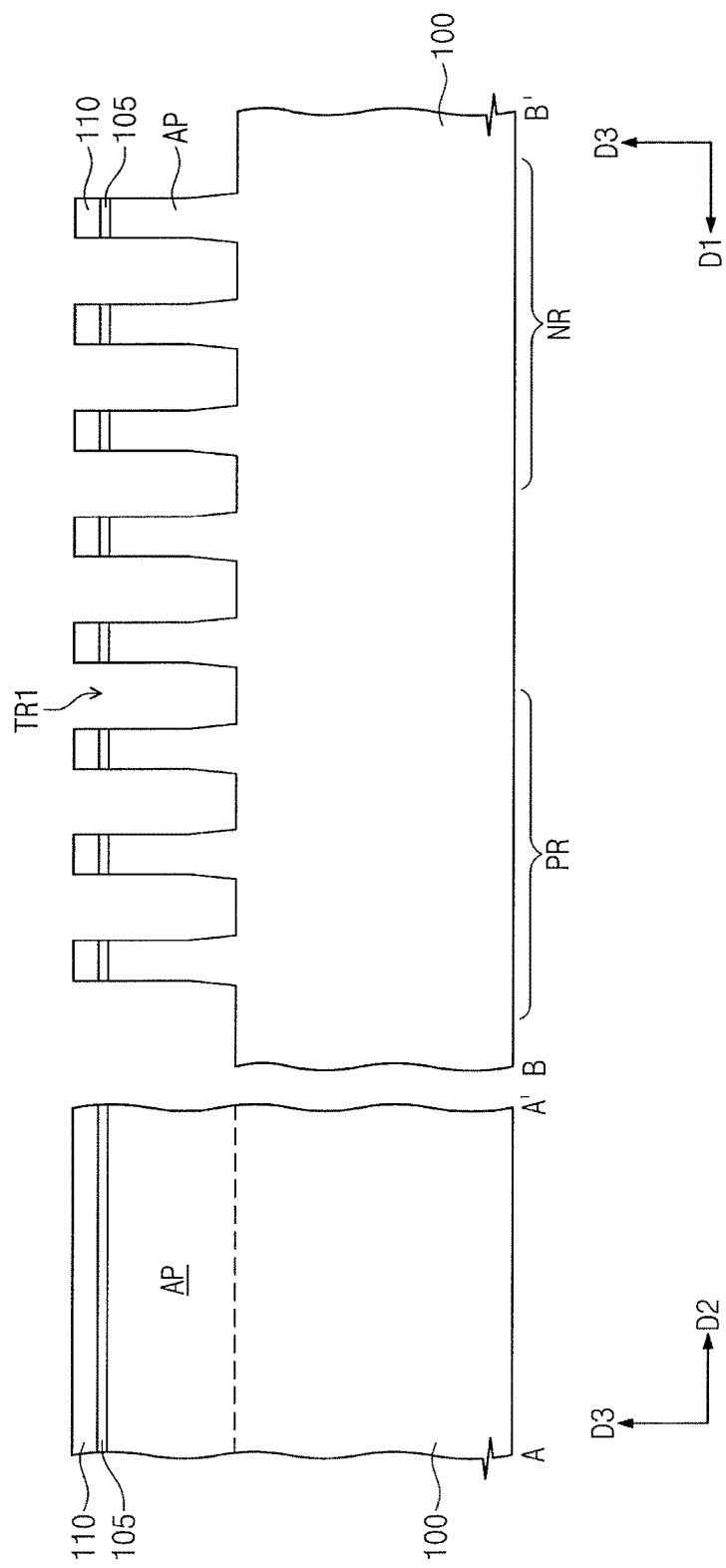

Referring to FIGS. 20A and 20B, a substrate 100 may be patterned to form active patterns AP. The substrate 100 may include an NMOSFET region NR and a PMOSFET region PR. The NMOSFET region NR may be an active region on which an n-type transistor is disposed. The PMOSFET region PR may be an active region on which a p-type transistor is disposed. The NMOSFET region NR and the PMOSFET region PR may be arranged in a first direction D1. For example, the NMOSFET region NR and the PMOSFET region PR may be included in a logic circuit in a logic cell region of a semiconductor device.

Formation of the active patterns AP may include etching an upper portion of the substrate 100 to form first trenches TR1 defining the active patterns AP.

Figure 21A:
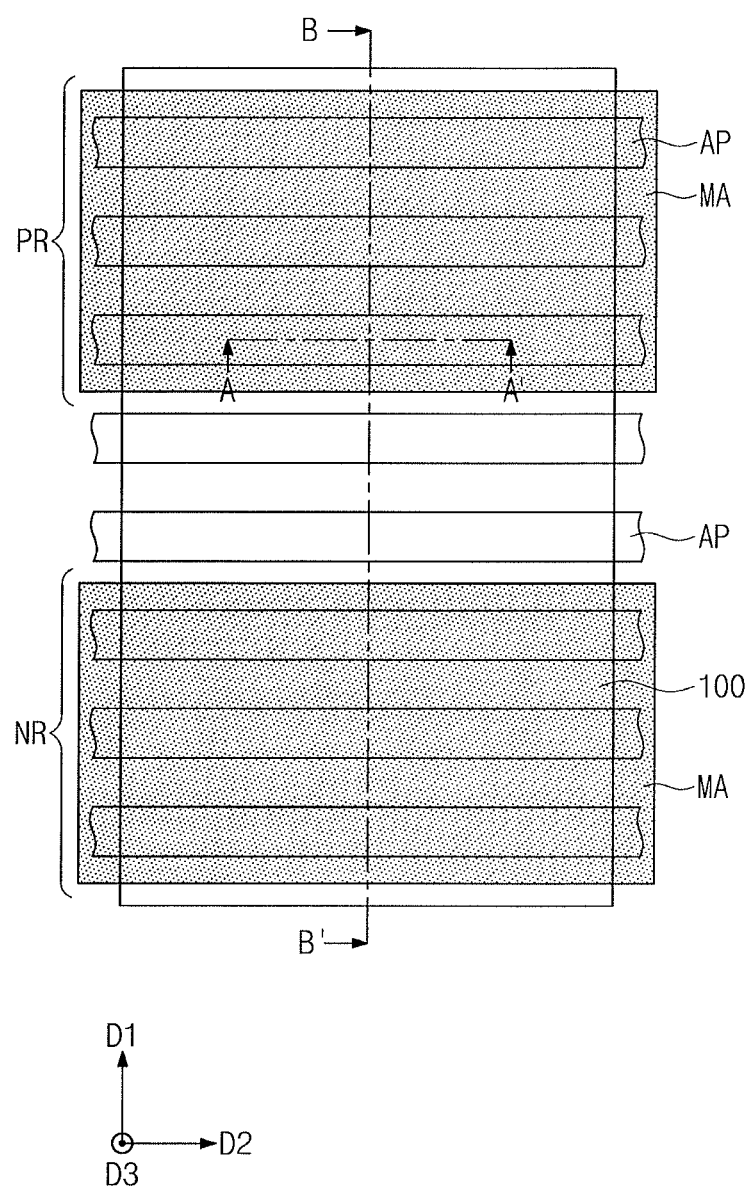
Figure 21B:
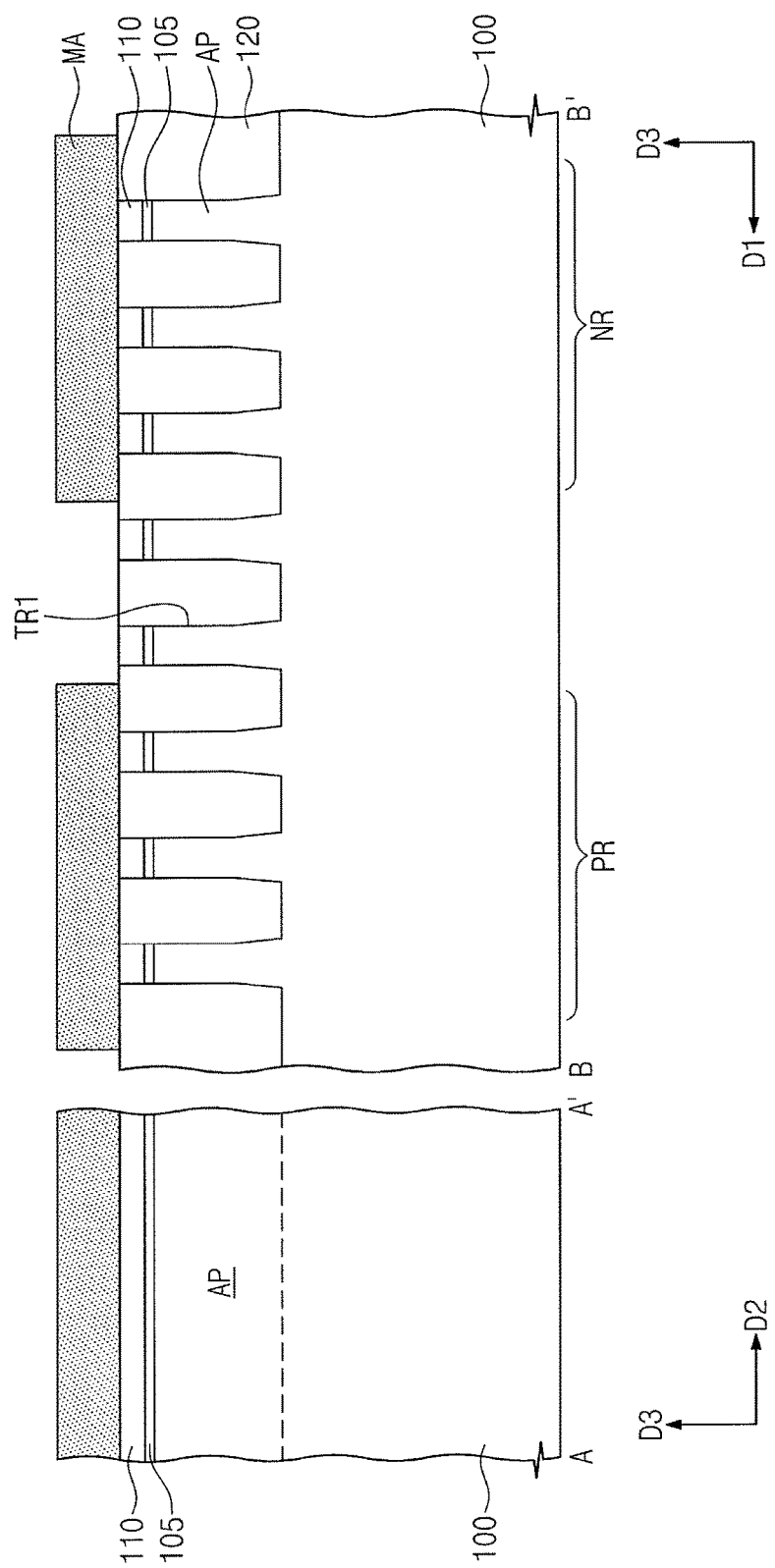

Referring to FIGS. 21A and 21B, a first insulation layer 120 may fill the first trenches TR1. Second mask patterns MA may be formed on the first insulation layer 120. The second mask patterns MA may respectively vertically overlap the NMOSFET and PMOSFET regions NR and PR. In one embodiment, the second mask patterns MA may not vertically overlap the active patterns AP on other portion of the substrate 100 not occupied by the NMOSFET and PMOSFET regions NR and PR.

Figure 22A:
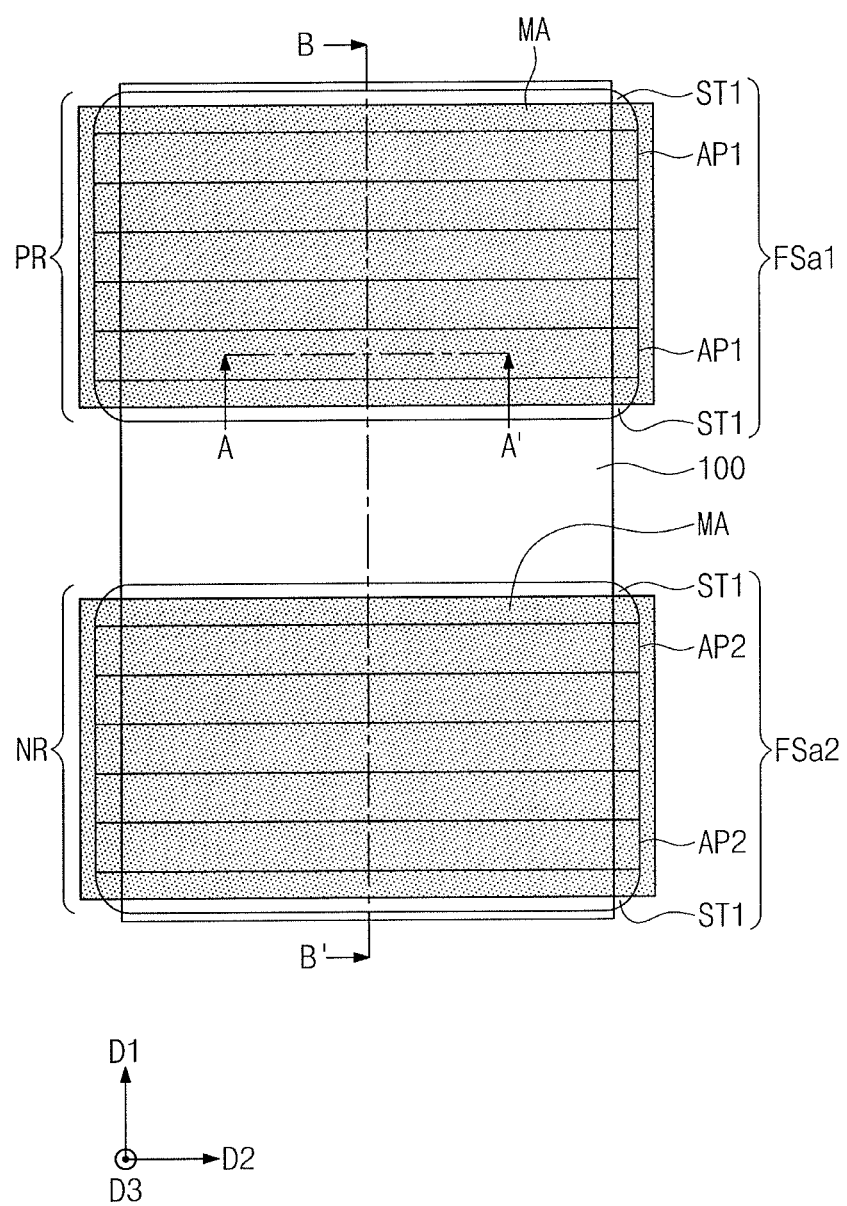
Figure 22B:
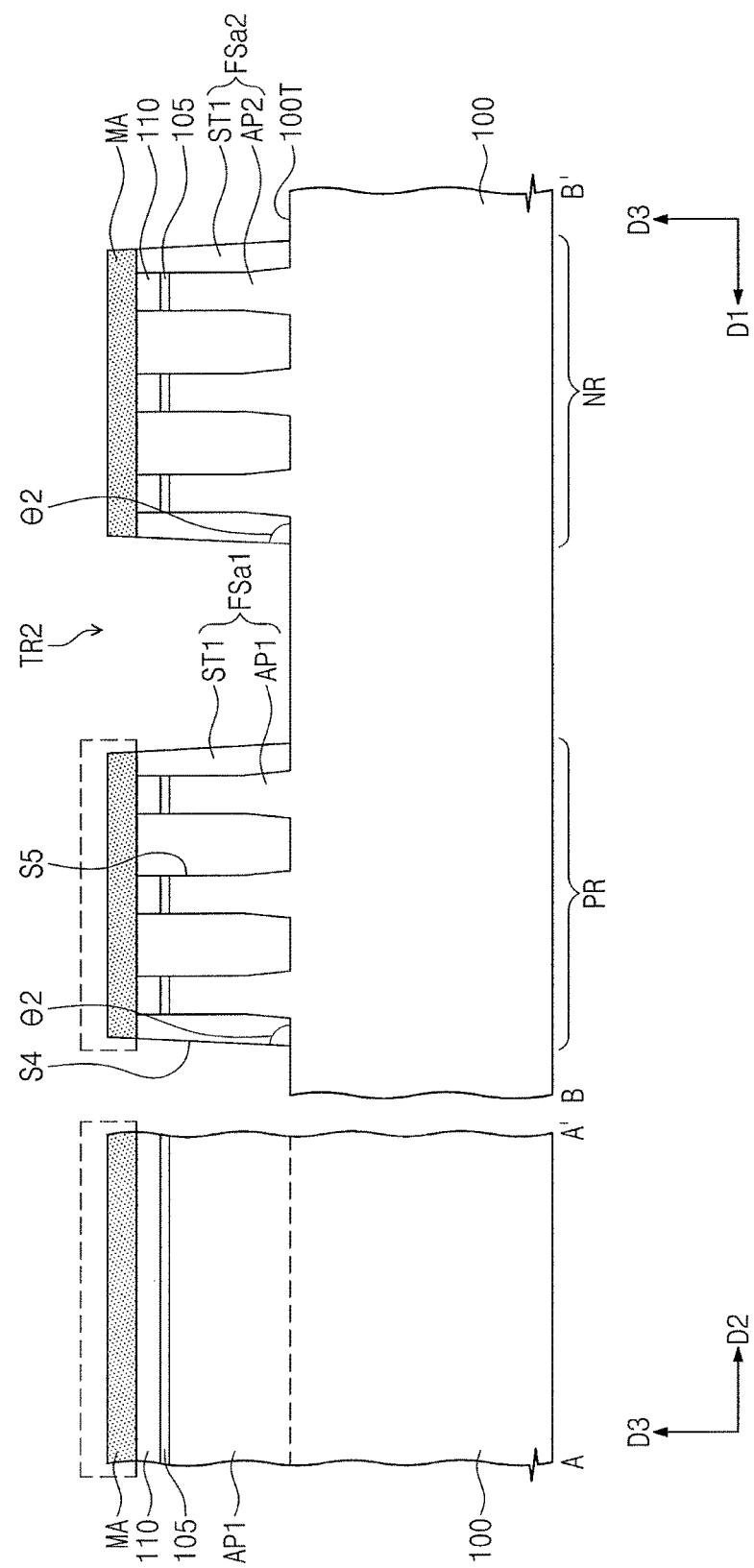

Referring to FIGS. 22A and 22B, a first etch process may be performed to form a first preliminary fin structure FSa1, a second preliminary fin structure FSa2, and a second trench TR2 that defines the first and second preliminary fin structures FSa1 and FSa2. The first preliminary fin structure FSa1 may be formed on the PMOSFET region PR, and the second preliminary fin structure FSa2 may be formed on the NMOSFET region NR. The first etch process may be, for example, substantially the same as or similar to that of the first etch process with reference to FIGS. 6A, 6B, 10, 11 and 12.

The first preliminary fin structure FSa1 may include first active patterns AP1 and first device isolation patterns ST1 remaining on the PMOSFET region PR. The first device isolation patterns ST1 may be formed by removing a portion of the first insulation layer 120 that is exposed through the second mask patterns MA.

The first device isolation patterns ST1 may directly cover fifth sidewalls S5, extending in a second direction D2, of the first active patterns AP1. At least one of the first device isolation patterns ST1 may include a fourth sidewall S4 that is exposed through the second trench TR2. The first preliminary fin structure FSa1 may include a sidewall (e.g., the fourth sidewall S4) extending in the second direction D2. The fourth sidewall S4 may be inclined relative to a top surface 100T of the substrate 100 at a second angle θ2. The second angle θ2 may be, for example, in the range of about 85° to about 90°.

The second preliminary fin structure FSa2 may include second active patterns AP2 and the first device isolation patterns ST1 remaining on the NMOSFET region NR. The second fin preliminary structure FSa2 may be, for example, substantially the same as or similar to that of the first fin preliminary structure FSa1.

Figure 23A:
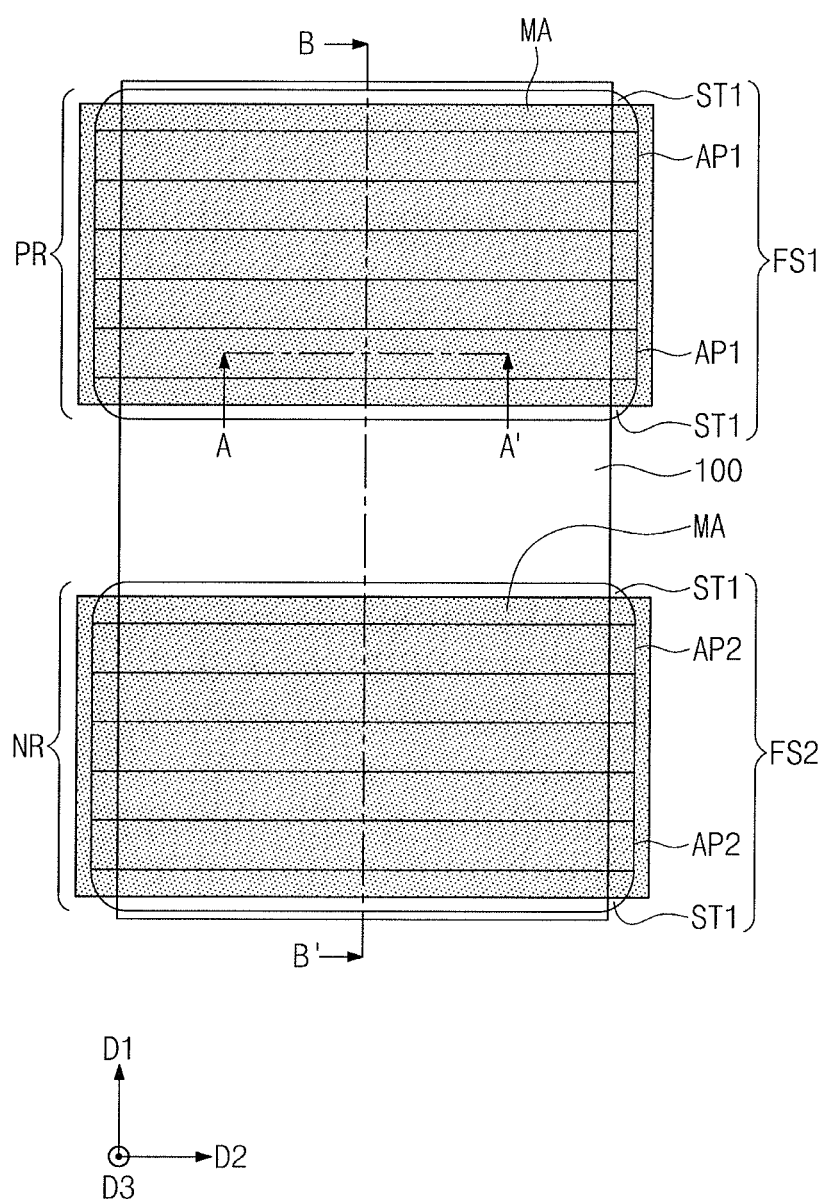
Figure 23B:
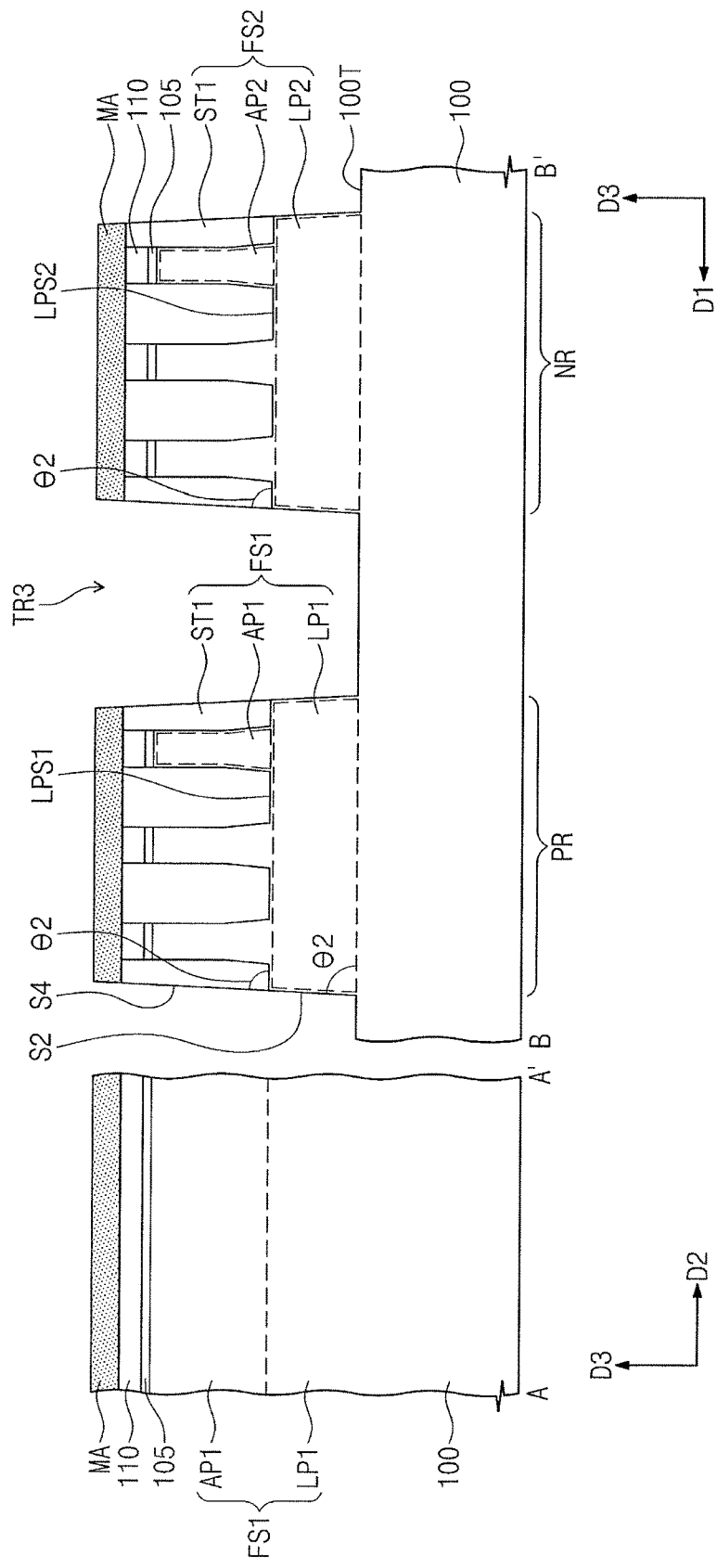

Referring to FIGS. 23A and 23B, a third etch process may be performed to form a first fin structure FS1, a second fin structure FS2, and a third trench TR3 that defines the first and second fin structures FS1 and FS2. The third etch process may be, for example, substantially the same as or similar to that in FIGS. 7A and 7B.

In one embodiment, the third etch process may include etching an exposed upper portion (e.g., a floor of the second trench TR2) of the substrate 100 using remaining second mask patterns MA as an etch mask. Therefore, the upper portion of the substrate 100 may be patterned to form first and second lower patterns LP1 and LP2. The first and second lower patterns LP1 and LP2 may respectively constitute lower portions of the first and second fin structures FS1 and FS2.

The third etch process may be performed, for example, along the etch profile formed by the first etch process. In one embodiment, the first lower patterns LP1 may include a second sidewall S2 extending in the second direction D2. The second sidewall S2 of the first lower pattern LP1 may be aligned with the fourth sidewall S4 of the first device isolation pattern ST1. The second sidewall S2 may be inclined relative to the top surface 100T of the substrate 100 at an angle, for example, substantially the same as the second angle θ2.

Figure 24A:
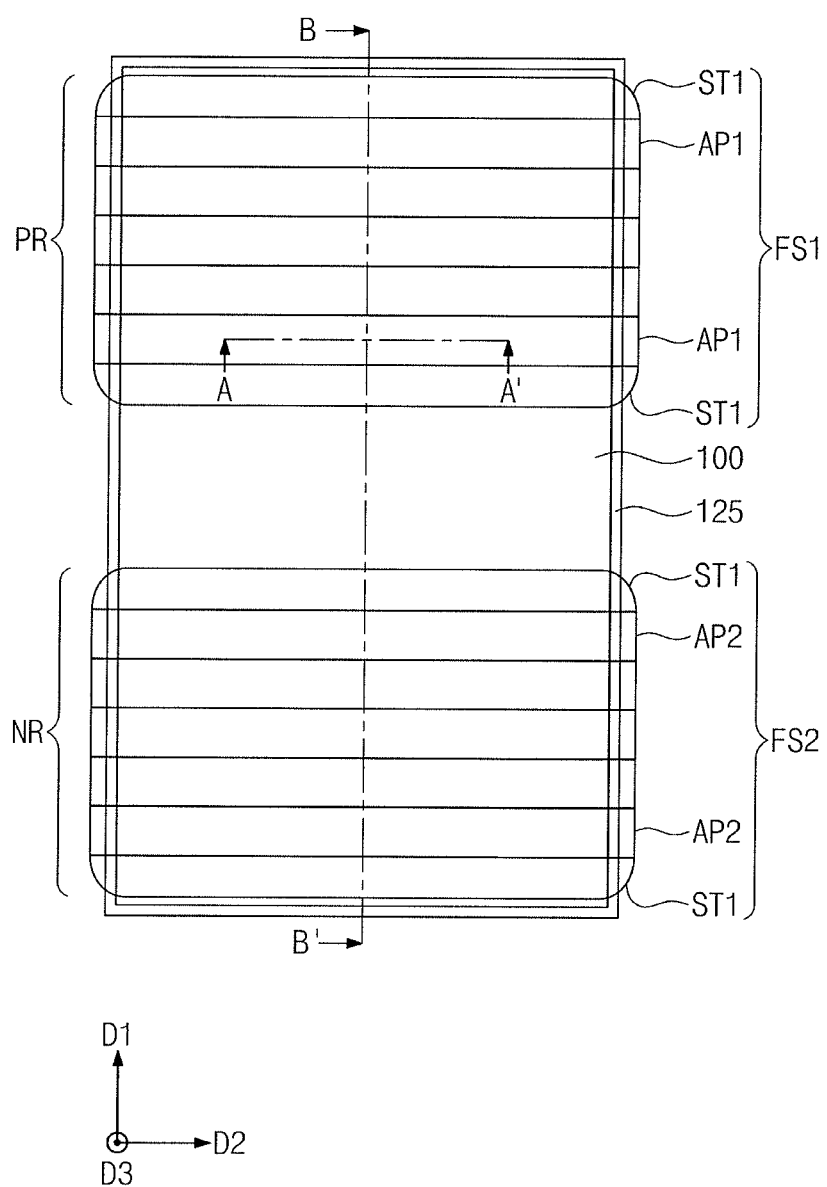
Figure 24B:
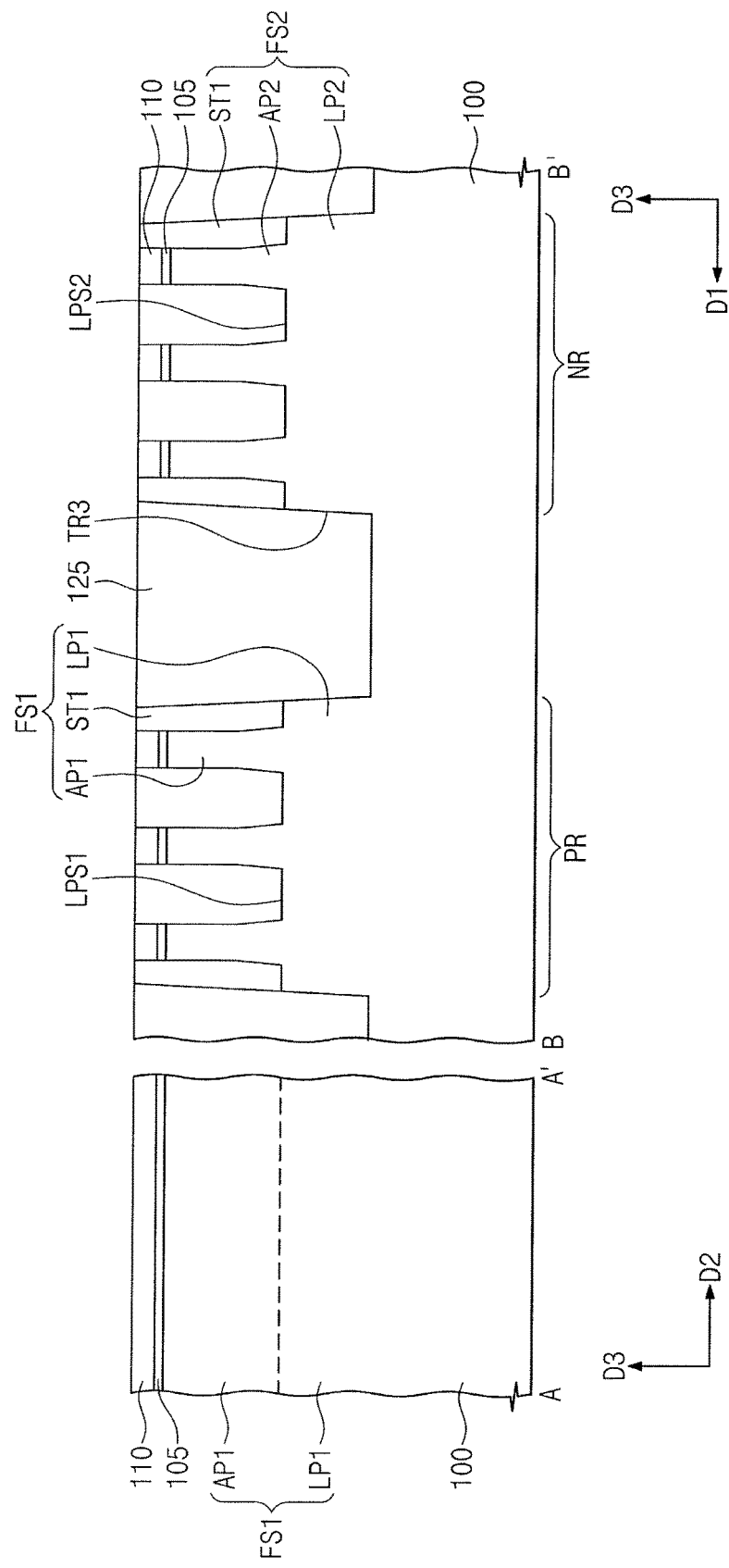

Referring to FIGS. 24A and 24B, the second mask patterns MA may be removed. Thereafter, a second insulation layer 125 may fill the third trench TR3.

Figure 25A:
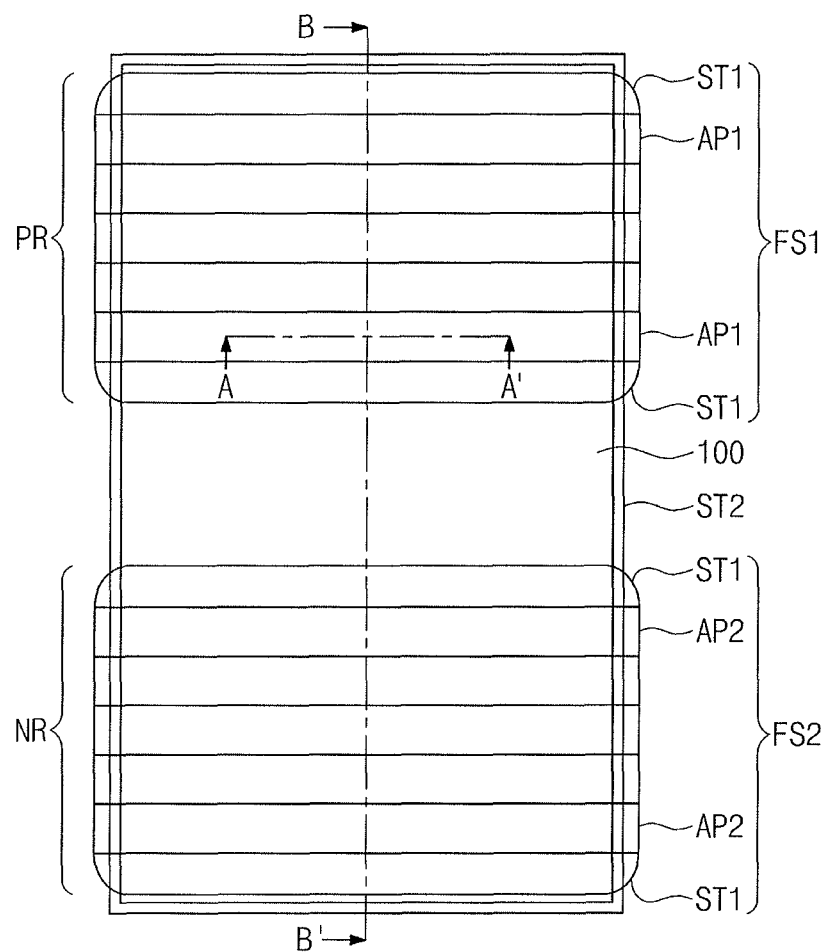

Referring to FIGS. 25A and 25B, remaining first mask patterns 110 may be removed. Then, an upper portion of the second insulation layer 125 may be removed to form a second device isolation pattern ST2. When the upper portion of the second insulation layer 125 is removed, buffer patterns 105 and upper portions of the first device isolation patterns ST1 may be removed together with the upper portion of the second insulation layer 125, such that upper portions FN of the first and second active patterns AP1 and AP2 are revealed.

Figure 26A:
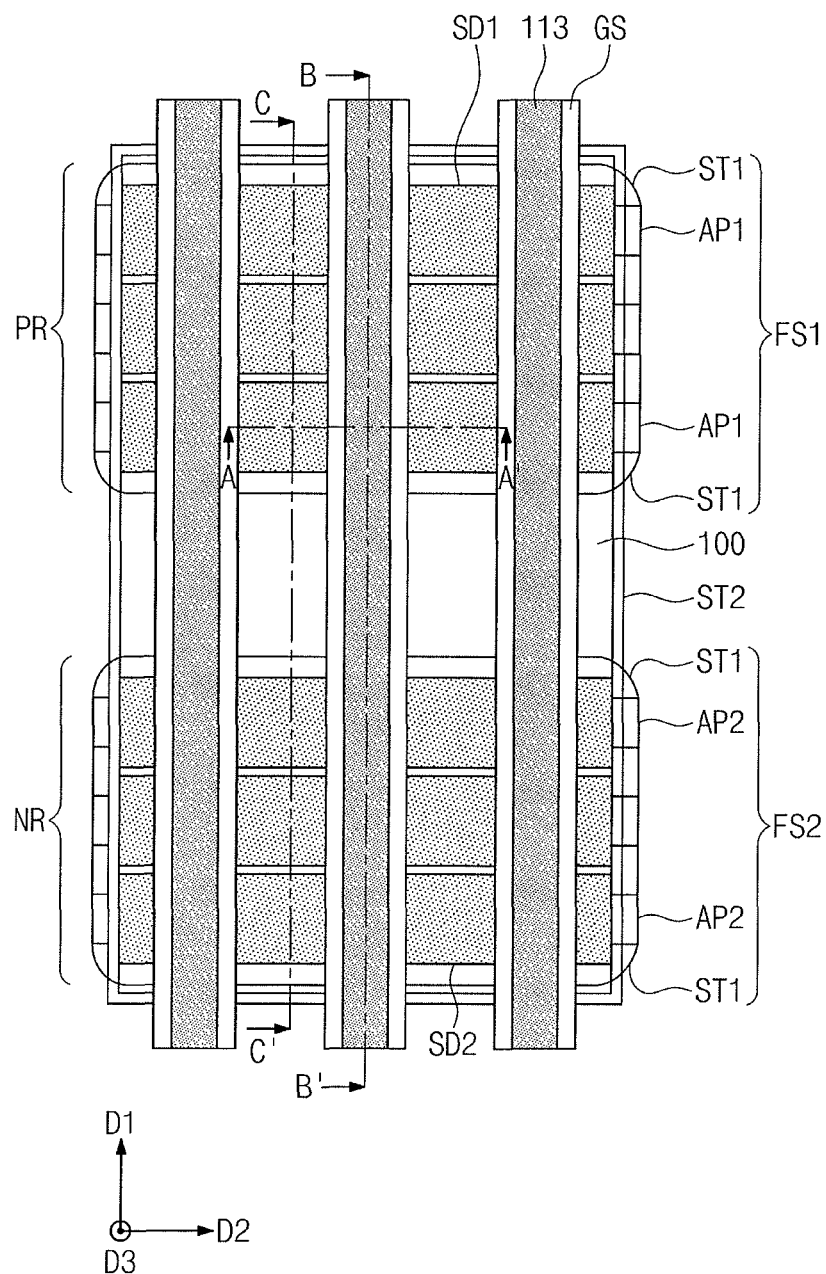
Figure 26B:
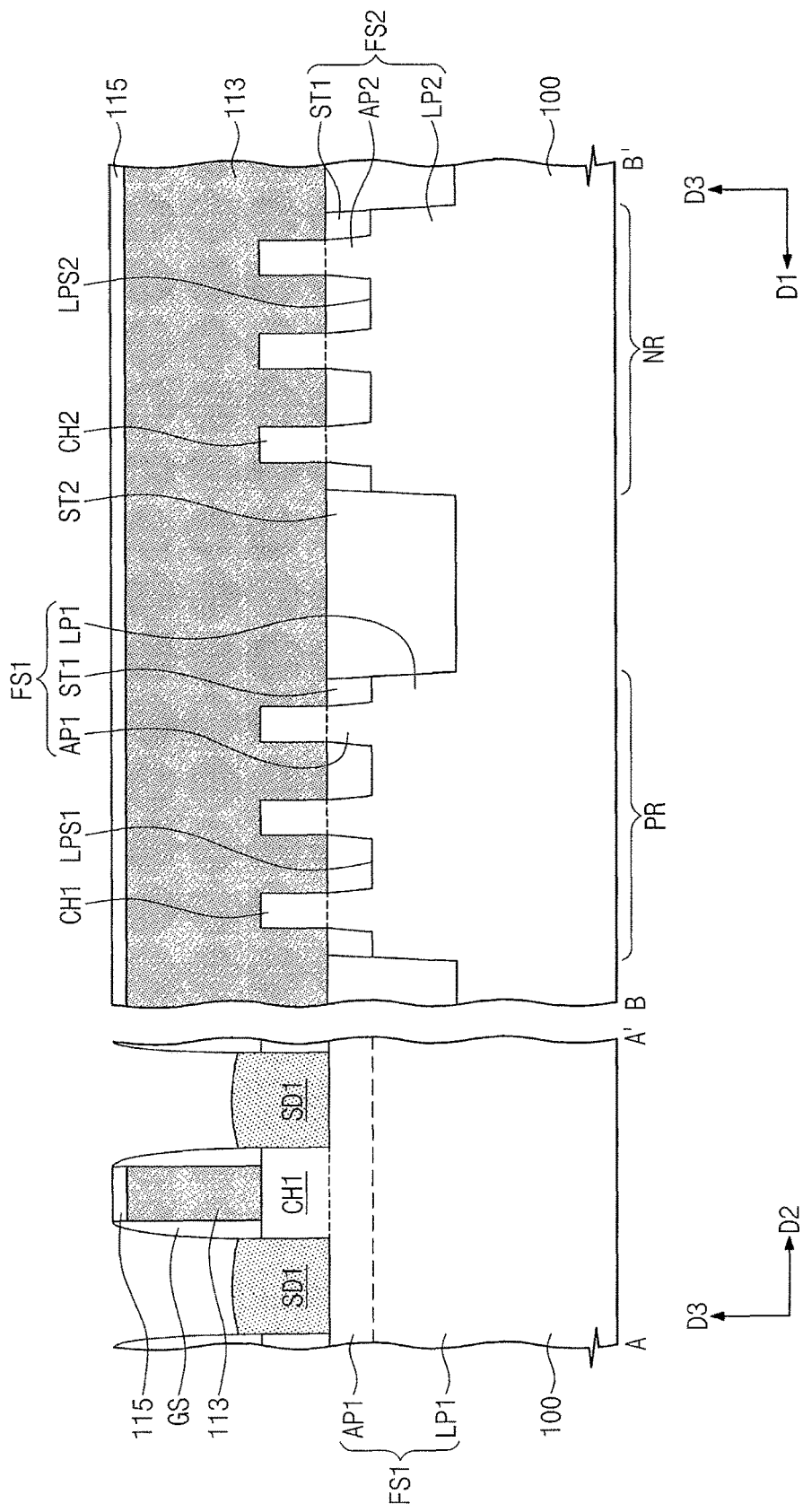
Figure 26C:
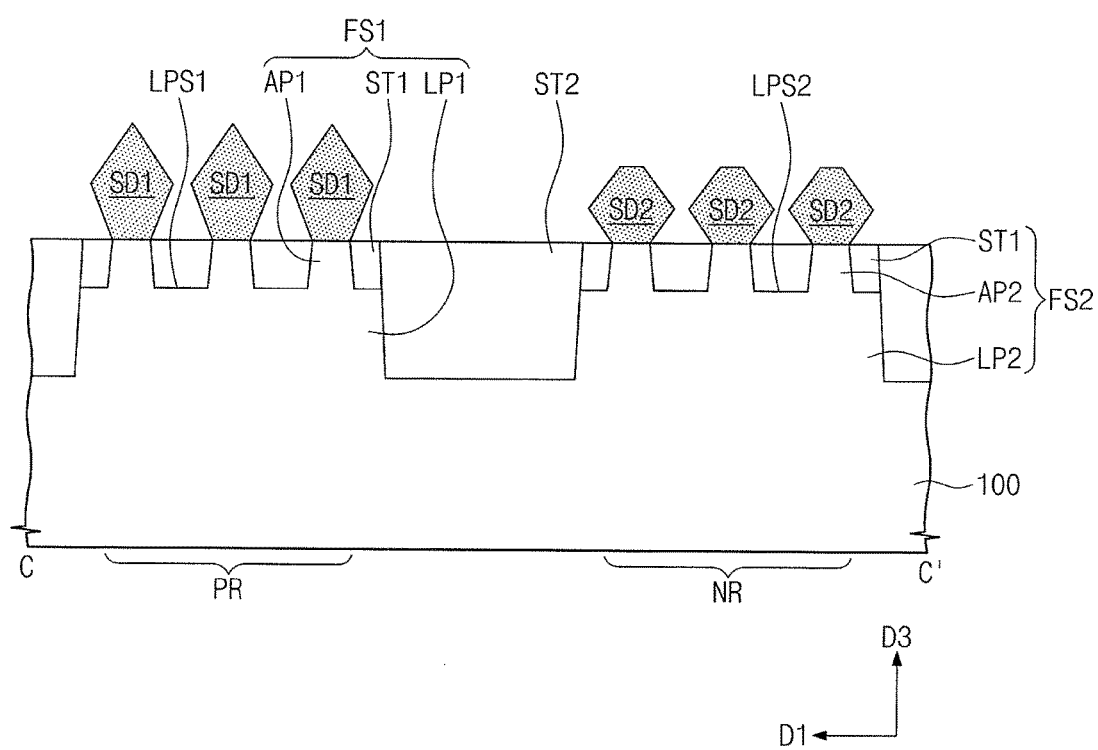
FIG. 26C illustrates a view taken along line C-C' in FIG. 26A.

Referring to FIGS. 26A, 26B and 26C, sacrificial gate patterns 113 and gate mask patterns 115 thereon may be formed on the substrate 100. Each of the sacrificial gate patterns 113 may be formed to run across in the first direction D1 on the upper portions FN of the first and second active patterns AP1 and AP2. The sacrificial gate patterns 113 may be spaced apart from each other in the second direction D2.

The upper portions FN of the first and second active patterns AP1 and AP2 may be removed from between the sacrificial gate patterns 113. Each of the first and second source/drain patterns SD1 and SD2 may be formed between the sacrificial gate patterns 113. The first and second source/drain patterns SD1 and SD2 may be formed, for example, by selective epitaxial growth processes using the first and second active patterns AP1 and AP2 as seed layers, respectively. The first source/drain patterns SD1 may be formed, for example, of SiGe and the second source/drain patterns SD2 may be formed, for example, of Si or SiC. The first and second source/drain patterns SD1 and SD2 may be doped with n-type or p-type impurities at the same time as or after the selective epitaxial growth process.

Referring back to FIGS. 18, 19A, and 19B, an interlayer dielectric layer 130 may be formed on the substrate 100. The sacrificial gate patterns 113 may be replaced with gate electrodes GE. A gate dielectric pattern GI may be formed between each of the gate electrodes GE and each of the first and second active patterns AP1 and AP2. The gate dielectric pattern GI and the gate electrode GE may be partially recessed to form a capping pattern GP on the gate electrode GE. Source/drain contacts may be formed between the gate electrodes GE.

In accordance with one or more of the aforementioned embodiments, a semiconductor device may include a fin structure with ratio of length to width that is relatively small. The method may use a pulsed RF bias during an etch process for forming the fin structure. Thus, the fin structure may be formed without process defects.

Example embodiments have been disclosed herein, and although specific terms are employed, they are used and to be interpreted in a generic and descriptive sense only and not for purpose of limitation. The embodiments (or portions thereof) may be combined to form additional embodiments. In some instances, features, characteristics, and/or elements described in connection with a particular embodiment may be used singly or in combination with features, characteristics, and/or elements described in connection with other embodiments unless otherwise indicated. Accordingly, it will be understood that various changes in form and details may be made without departing from the spirit and scope of the embodiments set forth in the claims.

What is claimed is:

1. A semiconductor device, comprising:
   a fin structure vertically protruding from a substrate and extending in a first direction parallel to a top surface of the substrate; and
   a first device isolation pattern on the substrate, wherein the fin structure includes a lower pattern and an active pattern vertically protruding from a top surface of the lower pattern, wherein the top surface of the lower pattern includes a flat portion parallel to the top surface of the substrate, wherein the lower pattern includes a first sidewall extending in the first direction and a second sidewall extending in a second direction crossing the first direction, the first sidewall inclined relative to the top surface of the substrate at a first angle greater than a second angle corresponding to the second sidewall that is inclined relative to the top surface of the substrate, and wherein the first device isolation pattern covers the flat portion and at least one sidewall of a lower portion of the active pattern and exposes an upper portion of the active pattern.

2. The semiconductor device as claimed in claim 1, wherein the active pattern includes a third sidewall extending in the first direction and inclined relative to the top surface of the substrate at a third angle different from the first and second angles.

3. The semiconductor device as claimed in claim 1, wherein:
   the fin structure includes a length in the first direction and a width in the second direction, and
   a ratio of a maximum length to a maximum width is about 3.5 to about 5.

4. The semiconductor device as claimed in claim 1, further comprising
   a second device isolation pattern on the substrate adjacent to the first device isolation pattern, wherein the second device isolation pattern covers the first sidewall of the lower pattern, and wherein a top surface of the first device isolation pattern is coplanar with a top surface of the second device isolation pattern.

5. The semiconductor device as claimed in claim 1, further comprising
   a contact plug on the substrate and electrically connected to the active pattern,
   wherein the contact plug is to apply a voltage to the substrate through the fin structure.

6. The semiconductor device as claimed in claim 1, further comprising:
   a gate electrode running across the active pattern and extending in the second direction on the substrate; and
   a source/drain pattern adjacent to at least one side of the gate electrode and on the active pattern.

7. A semiconductor device, comprising:
   a fin structure vertically protruding from a substrate and extending in a first direction parallel to a top surface of the substrate, the fin structure including a lower pattern and an active pattern vertically protruding from a top surface of the lower pattern; and
   a device isolation layer surrounding the lower pattern and a lower portion of the active pattern and exposing an upper portion of the active pattern, wherein the lower pattern includes a first sidewall extending in the first direction, the first sidewall inclined relative to the top surface of the substrate at a first angle, and wherein the lower portion of the active pattern includes a second sidewall extending in the first direction and inclined relative to the top surface of the substrate at a second angle different from the first angle.

8. The semiconductor device as claimed in claim 7, wherein the lower pattern includes a third sidewall extending in a second direction crossing the first direction, the third sidewall inclined relative to the top surface of the substrate at a third angle smaller than the first angle.

9. The semiconductor device as claimed in claim 7, wherein:
   the fin structure includes a length in the first direction and a width in the second direction, and
   a ratio of a maximum length to a maximum width is about 3.5 to about 5.

10. The semiconductor device as claimed in claim 7, further comprising a contact plug on the substrate and electrically connected to the active pattern, wherein the contact plug is to apply a voltage to the substrate through the fin structure.

11. The semiconductor device as claimed in claim 7, further comprising:
   a gate electrode running across the active pattern and extending in the second direction on the substrate; and
   a source/drain pattern adjacent to at least one side of the gate electrode and on the active pattern.

* * * * *